(12) United States Patent
Lee et al.

(10) Patent No.: US 12,745,550 B2
(45) Date of Patent: Sep. 22, 2026

(54) DISPLAY DEVICE

(71) Applicant: LG Display Co., Ltd., Seoul (KR)

(72) Inventors: Mose Lee, Bucheon-si (KR); GyuHo Lee, Seoul (KR); Suk Choi, Hwaseong-si (KR); Booheung Lee, Gimpo-si (KR)

(73) Assignee: LG Display Co., Ltd., Seoul (KR)

(*) Notice: Subject to any disclaimer, the term of this patent is extended or adjusted under 35 U.S.C. 154(b) by 344 days.

(21) Appl. No.: 18/658,703

(22) Filed: May 8, 2024

(65) Prior Publication Data

US 2024/0423076 A1 Dec. 19, 2024

(30) Foreign Application Priority Data

Jun. 16, 2023 (KR) ........................ 10-2023-0077417

(51) Int. Cl.

*H10K 59/80* (2023.01)
*H10K 59/121* (2023.01)
*H10K 59/126* (2023.01)
*H10K 59/127* (2023.01)
*H10K 59/131* (2023.01)
*H10K 77/10* (2023.01)
*H10K 102/00* (2023.01)

(52) U.S. Cl.

CPC ..... *H10K 59/8794* (2023.02); *H10K 59/1213* (2023.02); *H10K 59/126* (2023.02); *H10K 59/127* (2023.02); *H10K 59/131* (2023.02); *H10K 77/111* (2023.02); *H10K 2102/311* (2023.02)

(58) Field of Classification Search

CPC ............. H10K 59/8794; H10K 59/131; H10K 59/1213; H10K 59/126; H10K 59/127; H10K 77/111; H10K 2102/311
USPC ........................................................... 257/40
See application file for complete search history.

(56) References Cited

U.S. PATENT DOCUMENTS 8,274,101 B2 * 9/2012 Venezia ................ H10F 39/199 257/225
10,128,302 B2 * 11/2018 Udrea ..................... G01J 5/024
10,591,360 B2 * 3/2020 Mainguet ............. A61B 5/1172
11,393,802 B2 7/2022 Kang et al.

FOREIGN PATENT DOCUMENTS

KR 20210043262 A 4/2021

* cited by examiner

*Primary Examiner* — Tu-Tu V Ho
(74) *Attorney, Agent, or Firm* — Seed Intellectual Property Law Group LLP

(57) ABSTRACT

A display device according to an embodiment of the present disclosure includes a flexible substrate configured to be stretchable and divided into a first area, a second area, and a third area. The display device includes a plurality of pixels disposed in the first area of the flexible substrate. The display device includes a plurality of heat transfer patterns disposed in the first area of the flexible substrate and configured to overlap the plurality of pixels, respectively. The display device includes a plurality of connection lines disposed in the second area of the flexible substrate and connected to the plurality of pixels, respectively. The display device includes a plurality of heat transfer lines disposed in the second area of the flexible substrate and connected to the plurality of heat transfer patterns, respectively, thereby effectively compensating for a temperature of the display device.

19 Claims, 12 Drawing Sheets

DISPLAY DEVICE

CROSS-REFERENCE TO RELATED APPLICATIONS

This application claims the priority of Korean Patent Application No. 10-2023-0077417 filed on Jun. 16, 2023, in the Korean Intellectual Property Office, the disclosure of which is incorporated herein by reference.

BACKGROUND

Technical Field

The present disclosure may be a stretchable display device, and more particularly, to a display device that may include a heat transfer pattern disposed to overlap a pixel, and a heat transfer line connected to the heat transfer pattern, thereby effectively compensating for a temperature of the display device.

Description of the Related Art

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, recently, display devices have been made by forming display parts, lines, and the like on substrates made of flexible plastic materials and having flexibility. The display devices are manufactured to be stretchable in particular directions and variously changeable in shapes, and thus attract attention as next-generation display devices.

BRIEF SUMMARY

Various embodiments of the present disclosure provide a display device capable of effectively compensating for a temperature of the display device.

Various embodiments of the present disclosure provide a display device with an improved effect of dissipating heat from the display device.

Various embodiments of the present disclosure provide a display device capable of improving reliability of signal transmission through a connection line and improving reliability related to flexibility.

Technical benefits of the present disclosure are not limited to the above-mentioned benefits, and other benefits, which are not mentioned above, can be clearly understood by those skilled in the art from the following descriptions.

A display device according to an embodiment of the present disclosure includes: a flexible substrate configured to be stretchable and divided into a first area, a second area, and a third area; a plurality of pixels disposed in the first area of the flexible substrate; a plurality of heat transfer patterns disposed in the first area of the flexible substrate and configured to overlap the plurality of pixels, respectively; a plurality of connection lines disposed in the second area of the flexible substrate and connected to the plurality of pixels, respectively; and a plurality of heat transfer lines disposed in the second area of the flexible substrate and connected to the plurality of heat transfer patterns, respectively, thereby effectively compensating for a temperature of the display device.

Other detailed matters of the exemplary embodiments are included in the detailed description and the drawings.

The display device according to the embodiments of the present disclosure includes the plurality of heat transfer patterns that overlaps the plurality of pixels, respectively, and includes a metallic material, such that the heat generated from the inside of the plurality of pixels may be effectively discharged through the heat transfer patterns. Therefore, it is possible to improve the effect of dissipating heat from the plurality of pixels.

In addition, the display device according to the embodiments of the present disclosure further includes the heat transfer gel disposed between the plurality of heat transfer patterns and the plurality of pixels, and the heat transfer patterns are more effectively and tightly attached to the concave-convex surface by means of the heat transfer gel, such that the heat transfer may be more effectively performed, and the heat dissipation effect may be further improved.

In addition, the display device according to the embodiments of the present disclosure may include the voltage sensing circuit configured to measure the voltage of any one of the plurality of heat transfer patterns, and the voltage feedback circuit configured to provide feedback on the measured voltage and apply feedback voltages to another of the plurality of heat transfer patterns. Therefore, in case that the temperatures in the plurality of pixels are decreased to be lower than the reference value, the temperatures in the plurality of pixels may be increased by the reference value by the feedback voltages applied to the plurality of heat transfer patterns, such that the temperature compensation may be effectively performed on the plurality of pixels.

In addition, the display device according to the embodiments of the present disclosure may include the trench structure, and each of the plurality of pixels may be disposed in the trench structure. Therefore, the level difference related to the plurality of connection lines is reduced, which may improve the reliability of signal transmission through the plurality of connection lines and improve the reliability related to flexibility of the plurality of connection lines.

The effects of the present disclosure are not limited to the aforementioned effects, and other effects, which are not mentioned above, will be apparently understood to a person having ordinary skill in the art from the following description.

The technical benefits to be achieved by the present disclosure, the means for achieving the benefits, and the effects of the present disclosure described above do not specify essential features of the claims, and, thus, the scope of the claims is not limited to the disclosure of the present disclosure.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
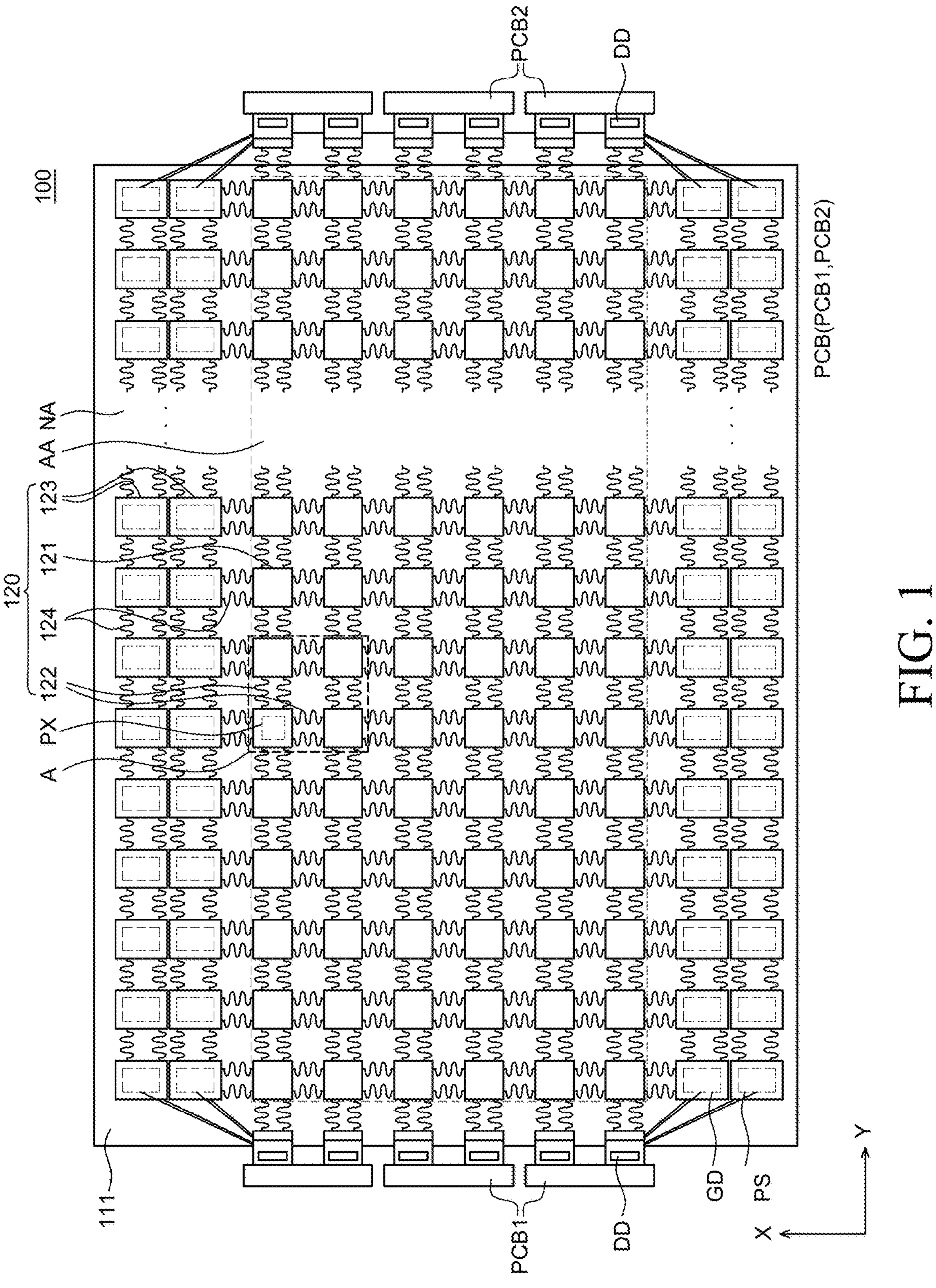
FIG. 1 is a top plan view illustrating a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, numbers, number of elements and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

A display device according to an embodiment of the present disclosure is a display device capable of displaying images even when being bent or stretched. The display device may also be referred to as a stretchable display device, a flexible display device, and an extendable display device. The display device may have not only high flexibility but also stretchability in comparison with a general display device in the related art. Therefore, a user may bend or stretch the display device, and a shape of the display device may be freely changed in accordance with the user's manipulation. For example, in case that the user holds and pulls an end of the display device, the display device may be stretched in a direction in which the user pulls the display device. Alternatively, in case that the user disposes the display device on a non-flat outer surface, the display device may be disposed to be curved along a shape of an outer surface of a wall surface. In addition, when the force applied by the user is eliminated, the display device may be restored back to an original shape.

FIG. 1 is a top plan view illustrating a display device according to an embodiment of the present disclosure.

Figure 2:
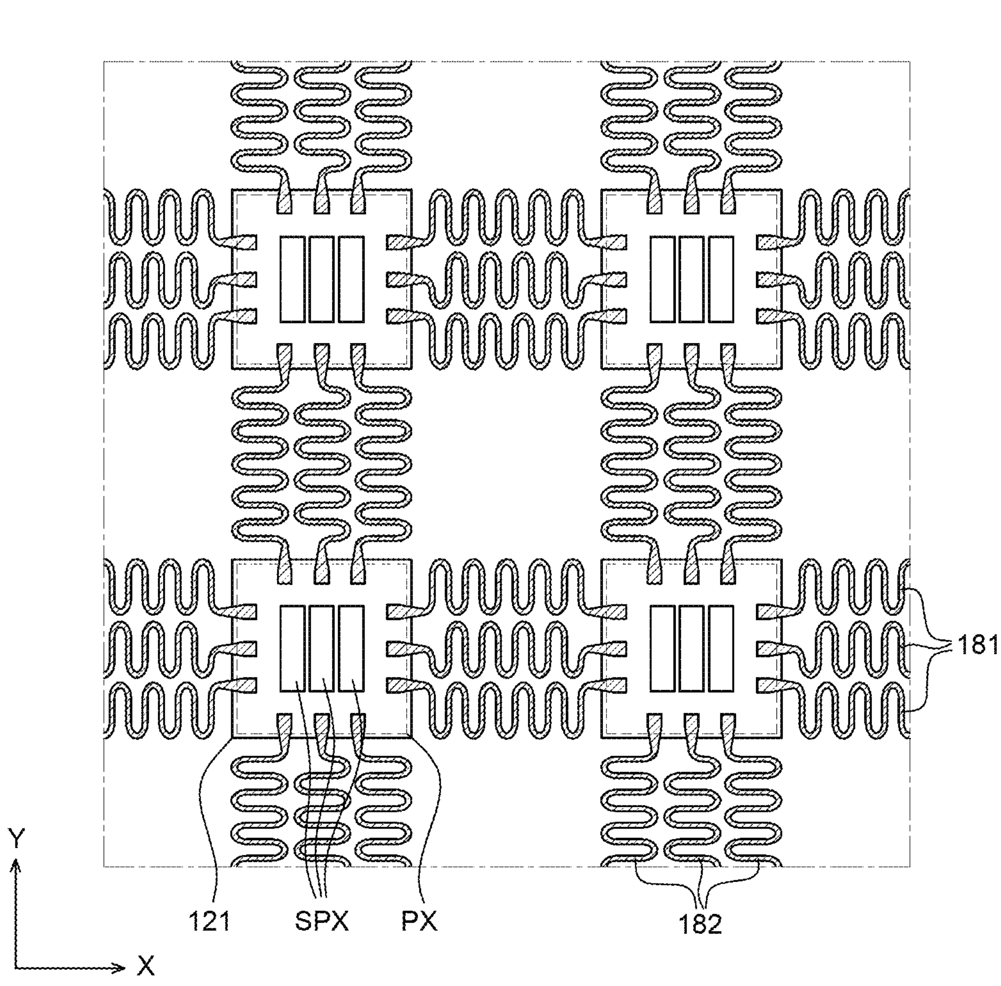
FIG. 2 is an enlarged top plan view of the display device according to the embodiment of the present disclosure.

FIG. 2 is an enlarged top plan view of the display device according to the embodiment of the present disclosure.

Meanwhile, FIG. 2 is an enlarged top plan view of area A illustrated in FIG. 1.

With reference to FIG. 1, a display device 100 according to an embodiment of the present disclosure may include a lower substrate 111 (or flexible substrate), a pattern layer 120, a plurality of pixels PX, a gate driver GD, a data driver DD, a power supply PS, and a printed circuit board PCB. In the embodiment, the display device 100 may further include a filling layer 190 (sec FIG. 4A) and an upper substrate 112 (see FIG. 4A).

The lower substrate 111 is a substrate configured to support and protect several constituent elements of the display device 100. Further, the upper substrate 112 (see FIG. 4A) is a substrate configured to cover and protect several constituent elements of the display device 100. That is, the lower substrate 111 is a substrate configured to support the pattern layer 120 on which the pixel PX, the gate driver GD, and the power supply PS are formed. Further, the upper substrate 112 (see FIG. 4A), which is opposite to the lower substrate 111, is a substrate configured to cover the pixel PX, the gate driver GD, and the power supply PS.

The lower substrate 111 and the upper substrate 112 (see FIG. 4A) may each be a flexible substrate made of an insulating material that is bendable or stretchable. For example, the lower substrate 111 and the upper substrate 112 (see FIG. 4A) may each include silicone rubber such as polydimethylsiloxane (PDMS) or elastomer such as polyurethane (PU) or polytetrafluoroethylene (PTFE). Therefore, the lower substrate 111 and the upper substrate 112 (see FIG. 4A) may each have flexibility. According to the embodiment, the lower substrate 111 and the upper substrate 112 (see FIG. 4A) may be made of the same material. However, the present disclosure is not limited thereto. The lower substrate 111 and the upper substrate 112 may be variously modified.

The lower substrate 111 and the upper substrate 112 (see FIG. 4A) may each be a flexible substrate that may reversibly expand and contract. Therefore, the lower substrate 111 may also be referred to as a lower stretchable substrate, a lower contractible substrate, a lower extendable substrate, a lower flexible substrate, a lower ductile substrate, a first stretchable substrate, a first contractible substrate, a first extendable substrate, a first flexible substrate, or a first ductile substrate. The upper substrate 112 (see FIG. 4A) may also be referred to as an upper stretchable substrate, an upper contractible substrate, an upper extendable substrate, an upper flexible substrate, an upper ductile substrate, a second stretchable substrate, a second contractible substrate, a second extendable substrate, a second flexible substrate, or a second ductile substrate. In addition, the lower substrate 111 and the upper substrate 112 (see FIG. 4A) may each have an elastic modulus of several MPa to several hundreds of MPa. In addition, a ductile breaking rate of each of the lower substrate 111 and the upper substrate 112 (see FIG. 4A) may be 100% or more. In this case, the ductile breaking rate means an elongation ratio at a time point at which a stretching object breaks or cracks. In addition, a thickness of the lower substrate 111 may be 10 μm to 1 mm. However, the present disclosure is not limited thereto.

The lower substrate 111 may include a display area (active area AA), and a non-display area (non-active area NA) configured to surround the display area AA. However, the display area AA and the non-display area (non-active area NA) may be referred to for explaining the entire display device 100 without being referred to for explaining only the lower substrate 111.

The display area AA may be an area of the display device 100 in which images are displayed. The plurality of pixels PX may be disposed in the display area AA. The pixels PX may each include display elements, and various driving elements for operating the display elements. Various driving elements may include at least one thin-film transistor (TFT) and at least one capacitor. However, the present disclosure is not limited thereto. In addition, the plurality of pixels PX may each be connected to various lines. For example, the plurality of pixels PX may each be connected to various lines such as gate lines, data lines, high-potential voltage lines, low-potential voltage lines, reference voltage lines, and initialization voltage lines.

The non-display area NA may be an area in which no image is displayed. The non-display area NA may be disposed adjacent to the display area AA. For example, the non-display area NA may be an area that surrounds the display area AA. However, the present disclosure is not limited thereto. The non-display area NA may be an area of the lower substrate 111 that excludes the display area AA. The non-display area NA may be modified and divided into various shapes. Constituent elements for operating the plurality of pixels PX disposed in the display area AA may be disposed in the non-display area NA. The gate driver GD and the power supply PS may be disposed in the non-display area NA. In addition, a plurality of pads connected to the gate driver GD and the data driver DD may be disposed in the non-display area NA. The pads may be respectively connected to the plurality of pixels PX in the display area AA.

The pattern layer 120 may be disposed on the lower substrate 111. For example, the pattern layer 120 may be disposed between the lower substrate 111 and the upper substrate 112 (see FIG. 4A).

Specifically, with reference further to FIG. 2, the pattern layer 120 may include a plurality of first plate patterns 121 disposed in the form of islands spaced apart from one another, a plurality of second plate patterns 123 disposed in the form of islands spaced apart from one another, a plurality of first line patterns 122 configured to connect the plurality of first plate patterns 121, and a plurality of second line patterns 124 configured to connect the plurality of second plate patterns 123, as illustrated in FIG. 2. In the embodiment, the plurality of first plate patterns 121 and the plurality of first line patterns 122 may be disposed in the display area AA, and the plurality of second plate patterns 123 and the plurality of second line patterns 124 may be disposed in the non-display area NA.

Further, the plurality of pixels PX may be formed on the plurality of first plate patterns 121 disposed in the display area AA. In addition, the gate drivers GD and the power supplies PS may be formed on the plurality of second plate patterns 123 disposed in the non-display area NA.

Further, the plurality of first plate patterns 121 may be individually separated. Therefore, the plurality of first plate patterns 121 may also be referred to as a plurality of first island patterns or a plurality of first individual patterns.

In the embodiment, the gate drivers GD may be mounted on the plurality of second plate patterns 123 disposed in the non-display area NA. Various circuit components, such as various transistor, capacitors, lines, and the like, which constitute the gate drivers GD, may be disposed on the plurality of second plate patterns 123 disposed in the non-display area NA. However, this configuration is provided for illustrative purposes only, and the embodiment of the present disclosure is not limited thereto. The gate drivers GD may be mounted on the plurality of second plate patterns 123 disposed in the non-display area NA in a chip-on-film (COF) manner.

In the embodiment, the power supplies PS may be mounted on the plurality of second plate patterns 123 disposed in the non-display area NA. Power blocks, which are disposed on different layers, may be disposed on the plurality of second plate patterns 123 disposed in the non-display area NA. That is, the lower and upper power blocks may be sequentially disposed on the plurality of second plate patterns 123 disposed in the non-display area NA. For example, a low-potential voltage may be applied to the lower power block, and a high-potential voltage may be applied to the upper power block. Therefore, the low-potential voltage may be supplied to the plurality of pixels PX through the lower power block, and the high-potential voltage may be supplied to the plurality of pixels PX through the upper power block.

Further, the plurality of second plate patterns 123 may be individually separated. Therefore, the plurality of second plate patterns 123 may also be referred to as a plurality of second island patterns or a plurality of second individual patterns.

According to the embodiment, as illustrated in FIG. 1, a size of each of the plurality of second plate patterns 123 disposed in the non-display area NA may be larger than a size of each of the plurality of first plate patterns 121 disposed in the display area AA. More specifically, an area occupied by various circuit components, which constitute one stage of the gate driver GD, is relatively larger than an area occupied by the pixel PX, such that a size of each of the plurality of second plate patterns 123 disposed in the non-display area NA may be larger than a size of each of the plurality of first plate patterns 121 disposed in the display area AA.

FIG. 1 illustrates that the plurality of second plate patterns 123 disposed in the plurality of non-display areas NA is disposed at two opposite sides based on a second direction Y in the non-display area NA. However, this configuration is provided for illustrative purposes only, and the embodiment of the present disclosure is not limited thereto. For example, the plurality of second plate patterns 123 disposed in the non-display area NA may be disposed in any area of the non-display area NA. In addition, FIGS. 1 and 2 illustrate that the plurality of first plate patterns 121 and the plurality of second plate patterns 123 each have a quadrangular shape. However, this configuration is provided for illustrative purposes only, and the embodiment of the present disclosure is not limited thereto. The plurality of first plate patterns 121 and the plurality of second plate patterns 123 may be modified in various shapes.

Meanwhile, the plurality of first line patterns 122 may be patterns configured to connect the plurality of first plate patterns 121 adjacent to one another. The plurality of first line patterns 122 may be referred to as first connection patterns. That is, the plurality of first line patterns 122 may be disposed between the plurality of first plate patterns 121. In addition, the plurality of second line patterns 124 may be patterns configured to connect the plurality of second plate patterns 123 adjacent to one another. The plurality of second line patterns 124 may be referred to as second connection patterns. That is, the plurality of second line patterns 124 may be disposed between the plurality of second plate patterns 123.

In the embodiment, with reference to FIG. 1, the plurality of first line patterns 122 and the plurality of second line patterns 124 may each have a curved shape. For example, the plurality of first line patterns 122 and the plurality of second line patterns 124 may each have a sinusoidal shape. However, this configuration is provided for illustrative purposes only. The shape of each of the plurality of first line patterns 122 and the plurality of second line patterns 124 is not limited thereto. For example, the plurality of first line patterns 122 and the plurality of second line patterns 124 may each have a zigzag shape. As another example, the plurality of first line patterns 122 and the plurality of second line patterns 124 may each have various shapes such as a shape in which a plurality of rhombic substrates is connected at vertices. As described above, the numbers and shapes of the plurality of first line patterns 122 and the plurality of second line patterns 124 illustrated in FIG. 1 are examples. The plurality of first line patterns 122 and the plurality of second line patterns 124 may be variously changed in numbers and shapes in accordance with design.

In the embodiment, the plurality of first plate patterns 121, the plurality of first line patterns 122, the plurality of second plate patterns 123, and the plurality of second line patterns 124 are each a rigid pattern. For example, the plurality of first plate patterns 121, the plurality of first line patterns 122, the plurality of second plate patterns 123, and the plurality of second line patterns 124 may each be more rigid than the lower substrate 111 and the upper substrate 112 (sec FIG. 4A). Therefore, the plurality of first plate patterns 121, the plurality of first line patterns 122, the plurality of second plate patterns 123, and the plurality of second line patterns 124 may each have an elastic modulus higher than an elastic modulus of each of the lower substrate 111 and the upper substrate 112 (see FIG. 4A). The clastic modulus (modulus of elasticity) refers to a parameter that indicates a ratio of the substrate deformed by stress applied to the substrate. Hardness may increase relatively as the elastic modulus increases relatively. The plurality of first plate patterns 121, the plurality of first line patterns 122, the plurality of second plate patterns 123, and the plurality of second line patterns 124 may each have an elastic modulus that may be 1000 or more times higher than the elastic modulus of each of the lower substrate 111 and the upper substrate 112 (see FIG. 4A). However, this configuration is provided for illustrative purposes only, and the embodiment of the present disclosure is not limited thereto.

Figure 4A:
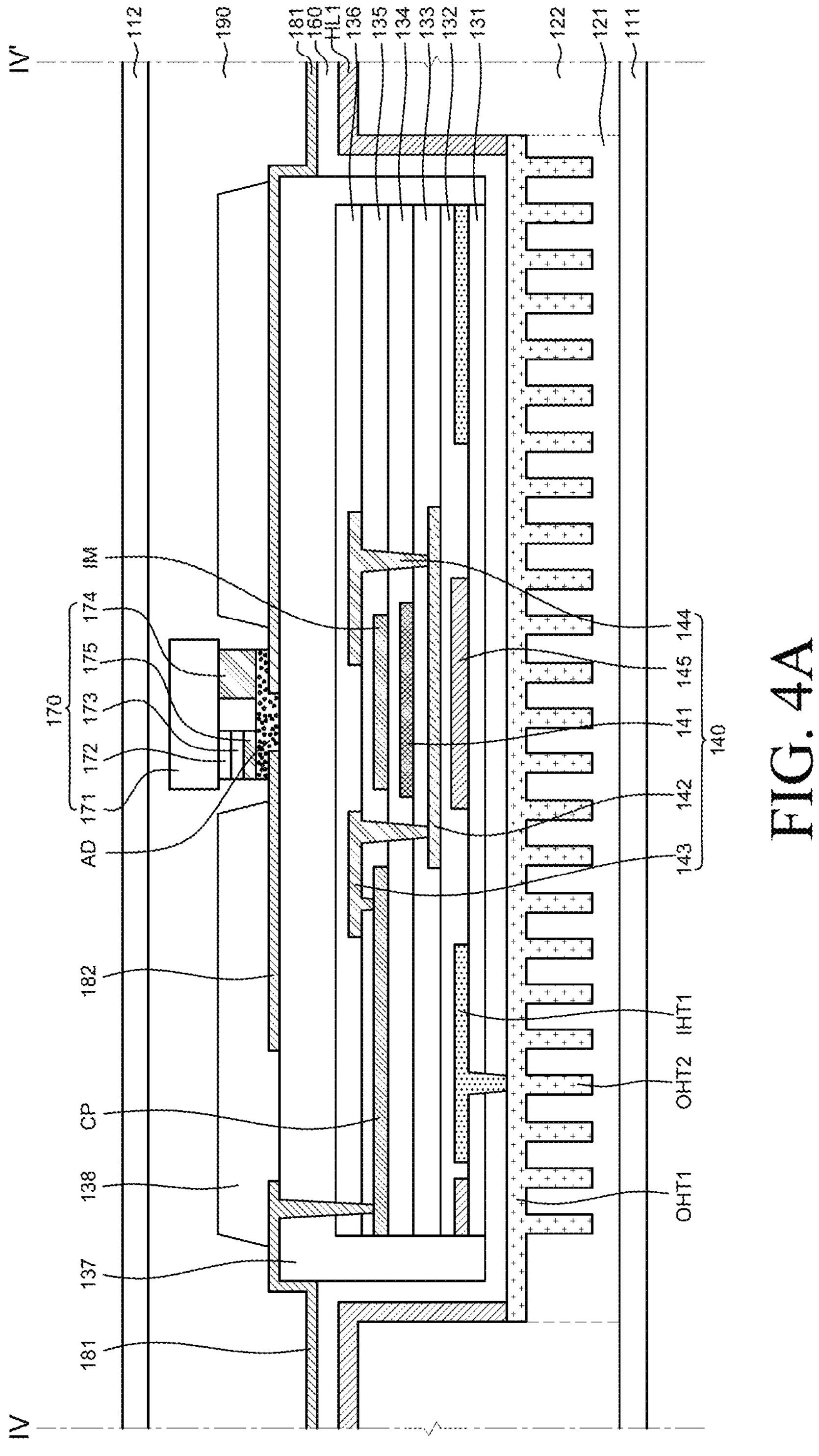
FIG. 4A is a cross-sectional view illustrating an example taken along cutting line IV-IV' illustrated in FIG. 3.

In the embodiment, the plurality of first plate patterns 121, the plurality of first line patterns 122, the plurality of second plate patterns 123, and the plurality of second line patterns 124 may each include a plastic material having lower flexibility than those of the lower substrate 111 and the upper substrate 112 (see FIG. 4A). For example, the plurality of first plate patterns 121, the plurality of first line patterns 122, the plurality of second plate patterns 123, and the plurality of second line patterns 124 may each include at least one of polyimide (PI), polyacrylate, and polyacetate. According to the embodiment, the plurality of first plate patterns 121, the plurality of first line patterns 122, the plurality of second plate patterns 123, and the plurality of second line patterns 124 may be made of the same material. However, the present disclosure is not limited thereto. The plurality of first plate patterns 121, the plurality of first line patterns 122, the plurality of second plate patterns 123, and the plurality of second line patterns 124 may be made of different materials. In case that the plurality of first plate patterns 121, the plurality of first line patterns 122, the plurality of second plate patterns 123, and the plurality of second line patterns 124 are made of the same material, the plurality of first plate patterns 121, the plurality of first line patterns 122, the plurality of second plate patterns 123, and the plurality of second line patterns 124 may be integrated.

In several embodiments, the lower substrate 111 may be defined as including a plurality of first lower patterns and a second lower pattern. The plurality of first lower patterns may be areas that overlap the plurality of first plate patterns 121 and/or the plurality of second plate patterns 123 of the lower substrate 111. The second lower pattern may be an area that does not overlap the plurality of first plate patterns 121 and/or the plurality of second plate patterns 123.

In addition, the upper substrate 112 (see FIG. 4A) may be defined as including a plurality of first upper patterns and a second upper pattern. The plurality of first upper patterns may be areas that overlap the plurality of first plate patterns 121 and/or the plurality of second plate patterns 123 of the upper substrate 112 (see FIG. 4A). The second upper pattern may be an area that does not overlap the plurality of first plate patterns 121 and/or the plurality of second plate patterns 123.

In this case, the plurality of first lower patterns and the plurality of first upper patterns may each have an elastic modulus higher than an elastic modulus of each of the second lower pattern and the second upper pattern. For example, the plurality of first lower patterns and the plurality of first upper patterns may each be made of the same material as the plurality of first plate patterns 121 or the plurality of second plate patterns 123. The second lower pattern and the second upper pattern may each be made of a material having a lower elastic modulus than those of the plurality of first plate patterns 121 or the plurality of second plate patterns 123.

For example, the first lower pattern and the first upper pattern may each be made of polyimide (PI), polyacrylate, polyacetate, or the like. The second lower pattern and the second upper pattern may each be made of silicone rubber such as polydimethylsiloxane (PDMS) or elastomer such as polyurethane (PU) or polytetrafluoroethylene (PTFE).

The gate driver GD may supply gate voltages to the plurality of pixels PX disposed in the display area AA. The gate drivers GD may include a plurality of stages formed on the plurality of second plate patterns 123 disposed in the non-display area NA. The stages included in the gate driver GD may be electrically connected to one another through a plurality of gate connection lines. Therefore, the gate voltage outputted from any one stage may be transmitted to another stage. Further, the stages may sequentially supply the gate voltages to the plurality of pixels PX respectively connected to the stages.

The power supply PS may be connected to the gate driver GD and supply a gate drive voltage and a gate clock voltage to the gate driver GD. Further, the power supply PS may be connected to the plurality of pixels PX and supply pixel drive voltages to the plurality of pixels PX. In addition, the power supplies PS may be formed on the plurality of second plate patterns 123 disposed in the non-display area NA. That is, the power supplies PS may be formed on the plurality of second plate patterns 123 disposed in the non-display area NA. The power supply PS may be disposed adjacent to the gate driver GD. Further, the plurality of power supplies PS formed on the plurality of second plate patterns 123 disposed in the non-display area NA may be electrically connected to the gate drivers GD and the plurality of pixels PX. That is, the plurality of power supplies PS formed on the plurality of second plate patterns 123 disposed in the non-display area NA may be connected to the gate drivers GD and the plurality of pixels PX by gate power connection lines and pixel power connection lines. Therefore, the plurality of power supplies PS may each supply the gate drive voltage, the gate clock voltage, and the pixel drive voltage.

The printed circuit board PCB may transmit signals and voltages for operating the display elements to the display elements from a controller. Therefore, the printed circuit board PCB may be referred to as a drive substrate. The controller such as IC chips and circuit parts may be mounted on the printed circuit board PCB.

In the embodiment, with reference to FIG. 1, the printed circuit board PCB may include first printed circuit boards PCB1 and second printed circuit boards PCB2 disposed at two opposite sides of the display device 100 based on the second direction Y. However, the printed circuit board PCB may be modified in various numbers and positions. In addition, memories, processors, and the like may be mounted on the printed circuit board PCB. Further, the printed circuit board PCB provided in the display device 100 may include a stretchable area and a non-stretchable area to ensure stretchability. Further, IC chips, circuit parts, memories, processors, and the like may be mounted in the non-stretchable area. Lines electrically connected to the IC chips, the circuit parts, the memories, and the processors may be disposed in the stretchable area.

The data driver DD may supply data voltages to the plurality of pixels PX disposed in the display area AA. The data driver DD may be configured in the form of an IC chip, and thus referred to as a data integrated circuit (D-IC). Further, the data driver DD may be mounted in the non-stretchable area of the printed circuit board PCB. That is, the data driver DD may be mounted on the printed circuit board PCB in a chip-on-board (COB) manner. FIG. 1 illustrates that the data driver DD is mounted in a chip-on-film (COF) manner. However, the present disclosure is not limited thereto. The data driver DD may be mounted in a chip-on-board (COF) manner, a chip-on-glass (COG) manner, a tape carrier package (TCP) manner, and the like.

In addition, FIG. 1 illustrates that a single data driver DD is disposed to correspond to one row of first plate patterns 121 disposed in the display area AA. However, the present disclosure is not limited thereto. For example, the single data driver DD may be disposed to correspond to a plurality of rows of first plate patterns 121.

Figure 3:
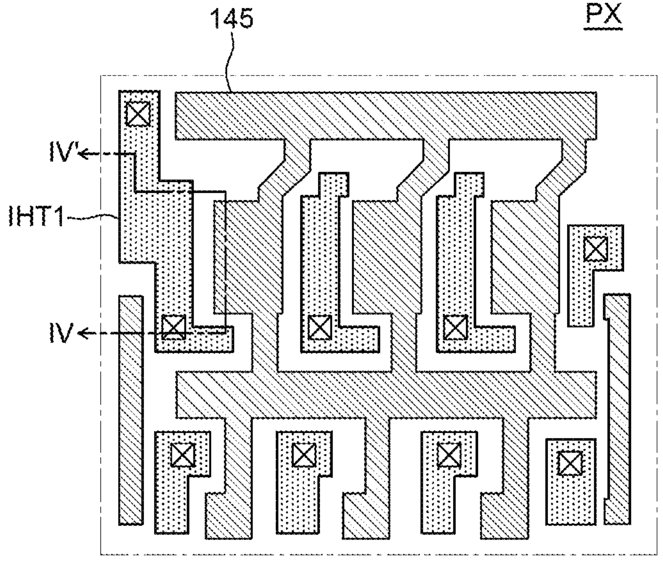
FIG. 3 is an enlarged top plan view illustrating an example of an area in which a pixel included in the display device in FIG. 2 is disposed.

FIG. 3 is an enlarged top plan view illustrating an example of an area in which a pixel included in the display device in FIG. 2 is disposed.

FIG. 4A is a cross-sectional view illustrating an example taken along cutting line IV-IV' illustrated in FIG. 3.

Figure 4B:
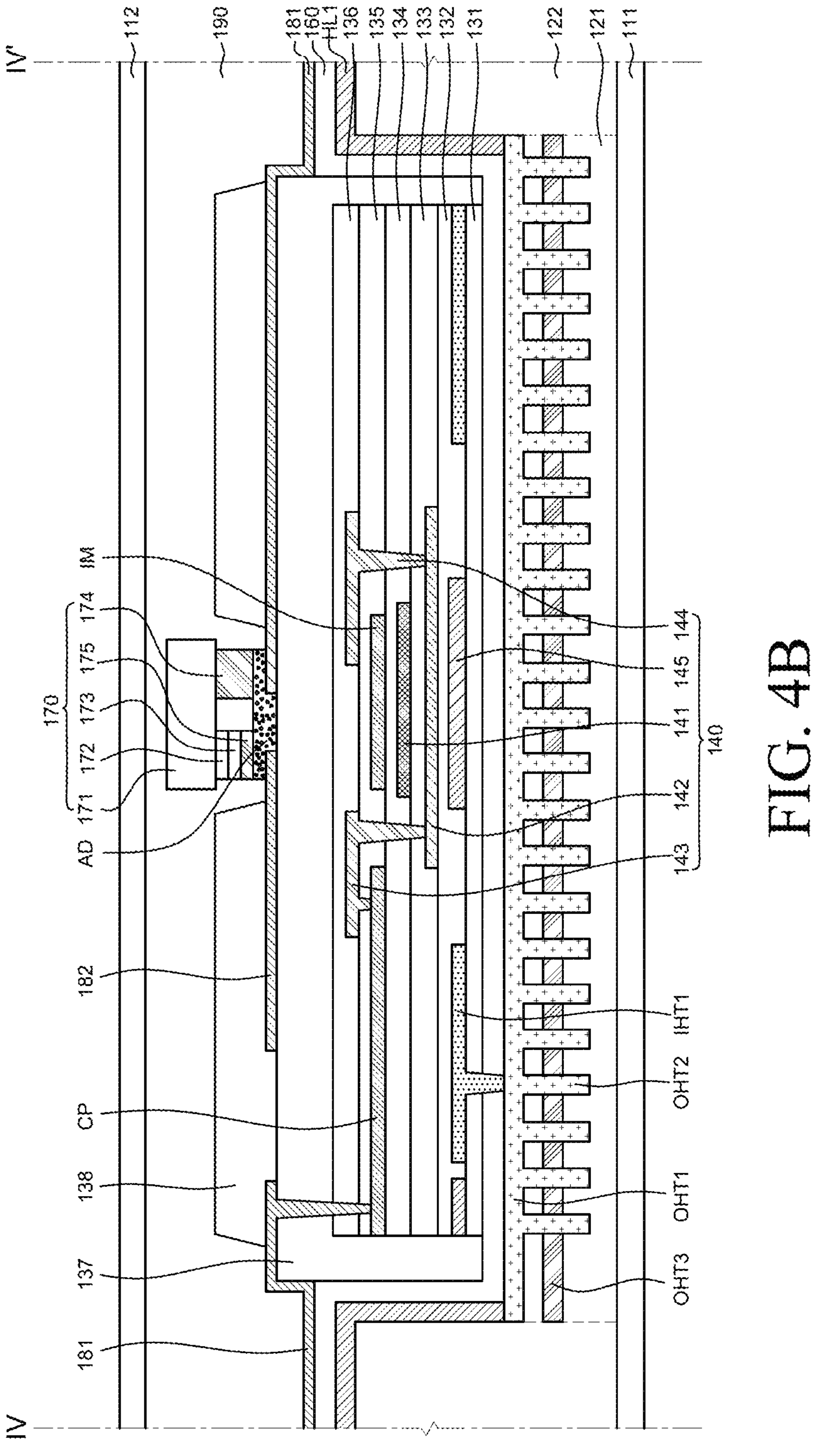
FIG. 4B is a cross-sectional view illustrating another example taken along cutting line IV-IV' illustrated in FIG. 3.

FIG. 4B is a cross-sectional view illustrating another example taken along cutting line IV-IV' illustrated in FIG. 3.

Meanwhile, FIG. 3 is a view illustrating a layer on which a shield metal layer 145 included in the pixel PX is disposed in the area in which the pixel PX included in the display device 100 in FIG. 2 is disposed.

With reference to FIGS. 2, 3, and 4A, the pixel PX including a plurality of subpixels SPX may be disposed on the first plate pattern 121 disposed on the lower substrate 111. The plurality of subpixels SPX may each include a light-emitting element 170, which is a display element, and a driving transistor 140 configured to operate the light-emitting element 170. However, in the subpixel SPX, the light-emitting element 160 is not limited to an LED but may be changed to an organic light-emitting diode. Further, the plurality of subpixels SPX may include a red subpixel, a green subpixel, and a blue subpixel. However, the present disclosure is not limited thereto. The colors of the plurality of subpixels SPX may be variously changed, as necessary.

The plurality of subpixels SPX may be connected to a plurality of connection lines 181 and 182. For example, the plurality of subpixels SPX may be electrically connected to a first connection line 181 extending in a first direction X, and the plurality of subpixels SPX may be electrically connected to a second connection line 182 extending in the second direction Y.

In the embodiment, the connection lines 181 and 182 connected to the subpixels SPX may include various lines such as gate lines (e.g., scan signal lines or light-emitting signal lines), data lines, high-potential voltage lines, low-potential voltage lines, and initialization voltage line.

Meanwhile, with reference to FIG. 4A, a plurality of inorganic insulation layers may be disposed on the plurality of first plate patterns 121. For example, the plurality of inorganic insulation layers may include a first buffer layer 131, a second buffer layer 132, a gate insulation layer 133, a first interlayer insulation layer 134, a second interlayer insulation layer 135, and a passivation layer 136. However, the embodiment of the present disclosure is not limited thereto. Various inorganic insulation layers may be additionally disposed on the plurality of first plate patterns 121.

Alternatively, at least one of the first buffer layer 131, the second buffer layer 132, the gate insulation layer 133, the first interlayer insulation layer 134, the second interlayer insulation layer 135, and the passivation layer 136, which are inorganic insulation layers, may be excluded.

More specifically, the first buffer layer 131 may be disposed on the plurality of first plate patterns 121. The first buffer layer 131 may be formed on the plurality of first plate patterns 121 in order to protect various constituent elements of the display device 100 from penetration of moisture ($H_2O$) and oxygen ($O_2$) from the outside of the lower substrate 111 and the plurality of first plate patterns 121. The first buffer layer 131 may be made of an insulating material. For example, the first buffer layer 131 may be configured as a single layer or multilayer made of at least one of silicon nitride (SiNx), silicon oxide (SiOx), and silicon oxynitride (SiON). However, the first buffer layer 131 may be excluded in accordance with the structure or properties of the display device 100.

The driving transistor 140 including a gate electrode 141, an active layer 142, a source electrode 143, a drain electrode 144, and the shield metal layer 145 may be formed on the first buffer layer 131. Meanwhile, although not illustrated separately, a switching transistor may be further formed on the first buffer layer 131.

First, the shield metal layer 145 (or lower gate electrode) of the driving transistor 140 may be disposed on the first buffer layer 131. The shield metal layer 145 may be disposed to overlap at least a part of the active layer 142 (e.g., a channel area of the active layer 142).

The shield metal layer 145 may include a metallic material. For example, the shield metal layer 145 may include a metallic material such as molybdenum (Mo) or titanium (Ti). According to the embodiment, the shield metal layer 145 may be configured as a single layer or multilayer made of any one of metallic materials such as molybdenum (Mo) and titanium (Ti) or an alloy thereof. However, this configuration is provided for illustrative purposes only, and the metallic material included in the shield metal layer 145 is not limited thereto.

The second buffer layer 132 may be disposed on the shield metal layer 145. For example, the second buffer layer 132 may be disposed on the first buffer layer 131 and cover the shield metal layer 145.

The second buffer layer 132 may be made of an insulating material. For example, the second buffer layer 132 may be configured as a single layer or multilayer made of at least one of silicon nitride (SiNx), silicon oxide (SiOx), and silicon oxynitride (SiON). However, the second buffer layer 132 may be excluded in accordance with the structure or properties of the display device 100.

In this case, the first buffer layer 131 and the second buffer layer 132 may be formed only in an area in which the lower substrate 111 overlaps the plurality of first plate patterns 121. As described above, because the first buffer layer 131 and the second buffer layer 132 may be made of an inorganic material, the display device 100 may be easily damaged or crack during a process of stretching the display device 100. Therefore, the first buffer layer 131 and the second buffer layer 132 may be formed only above the plurality of first plate patterns 121 by being patterned in the shapes of the plurality of first plate patterns 121 without being formed in the area between the plurality of first plate patterns 121. Therefore, in the display device 100 according to the embodiment of the present disclosure, the first buffer layer 131 and the second buffer layer 132 are formed only in the area that overlaps the plurality of first plate patterns 121 that is rigid patterns. Therefore, it is possible to suppress damage to various constituent elements of the display device 100 even though the display device 100 is deformed by being curved or stretched.

The active layer 142 of the driving transistor 140 may be disposed on the second buffer layer 132. For example, the active layer 142 of the driving transistor 140 may be made of an oxide semiconductor. Alternatively, the active layer 142 of the driving transistor 140 may be made of amorphous silicon (a-Si), polycrystalline silicon (poly-Si), an organic semiconductor, or the like.

The gate insulation layer 133 may be disposed on the active layer 142 of the driving transistor 140. The gate insulation layer 133 may electrically insulate the gate electrode 141 of the driving transistor 140 and the active layer 142 of the driving transistor 140. The gate insulation layer 133 may include an insulating material. For example, the gate insulation layer 133 may be configured as a single layer made of silicon nitride (SiNx) or silicon oxide (SiOx) that is an inorganic material. Alternatively, the gate insulation layer 133 may be configured as a multilayer made of silicon nitride (SiNx) or silicon oxide (SiOx). However, the present disclosure is not limited thereto.

The gate electrode 141 of the driving transistor 140 may be disposed on the gate insulation layer 133. In addition, the gate electrode 141 of the driving transistor 140 may overlap the active layer 142 of the driving transistor 140.

The gate electrode 141 of the driving transistor 140 may be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the gate electrode 141 of the driving transistor 140 may be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The first interlayer insulation layer 134 may be disposed on the gate electrode 141 of the driving transistor 140. The first interlayer insulation layer 134 may insulate the gate electrode 141 of the driving transistor 140 and an intermediate metal layer IM. Like the first buffer layer 131, the first interlayer insulation layer 134 may be made of an inorganic material. For example, the first interlayer insulation layer 134 may be configured as a single layer made of silicon nitride (SiNx) or silicon oxide (SiOx) that is an inorganic material. Alternatively, the first interlayer insulation layer 134 may be configured as a multilayer made of silicon nitride (SiNx) or silicon oxide (SiOx). However, the present disclosure is not limited thereto.

The intermediate metal layer IM may be disposed on the first interlayer insulation layer 134. The intermediate metal layer IM may overlap the gate electrode 141 of the driving transistor 140. Therefore, a capacitor (e.g., storage capacitor) may be formed in an area in which the intermediate metal layer IM and the gate electrode 141 of the driving transistor 140 overlap each other. Specifically, the storage capacitor may be formed by the gate electrode 141 of the driving transistor 140, the first interlayer insulation layer 134, and the intermediate metal layer IM. However, the arrangement area of the intermediate metal layer IM is not limited thereto. Various storage capacitors may be formed as the intermediate metal layer IM overlaps other electrodes.

The intermediate metal layer IM may be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the intermediate metal layer IM may be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The second interlayer insulation layer 135 may be disposed on the intermediate metal layer IM. The second interlayer insulation layer 135 may insulate the intermediate metal layer IM and the source electrode 143 and the drain electrode 144 of the driving transistor 140. Like the first buffer layer 131, the second interlayer insulation layer 135 may be made of an inorganic material. For example, the second interlayer insulation layer 135 may be configured as a single layer made of silicon nitride (SiNx) or silicon oxide (SiOx) that is an inorganic material. Alternatively, the second interlayer insulation layer 135 may be configured as a multilayer made of silicon nitride (SiNx) or silicon oxide (SiOx). However, the present disclosure is not limited thereto.

The source electrode 143 and the drain electrode 144 of the driving transistor 140 may be disposed on the second interlayer insulation layer 135. The source electrode 143 and the drain electrode 144 of the driving transistor 140 may be disposed on the same layer and spaced apart from each other. The source electrode 143 and the drain electrode 144 of the driving transistor 140 may be electrically connected to the active layer 142 while adjoining the active layer 142.

In addition, the source electrode 143 of the driving transistor 140 may be electrically connected to the first connection line 181 through a connection pattern CP disposed on the same layer as the intermediate metal layer IM. For example, the first connection line 181 is in contact with one end of the connection pattern CP, which is disposed on the first interlayer insulation layer 134, through contact holes formed through a planarization layer 137, the passivation layer 136, and the second interlayer insulation layer 135, and the source electrode 143 of the driving transistor 140 is in contact with the other end of the connection pattern CP, which is disposed on the first interlayer insulation layer 134, through a contact hole formed through the second interlayer insulation layer 135, such that the source electrode 143 of the driving transistor 140 may be electrically connected to the first connection line 181 through the connection pattern CP.

The source electrode 143 and the drain electrode 144 of the driving transistor 140 may each be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the source electrode 143 and the drain electrode 144 of the driving transistor 140 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

In addition, in the present specification, the driving transistor 140 has been described as having a coplanar structure. However, various transistors having a staggered structure may also be used. In addition, in the present specification, the transistor may have not only a top gate structure but also a bottom gate structure.

Meanwhile, although not illustrated separately, various types of pads, for example, a gate pad, a data pad, and a voltage pad may be disposed on the second interlayer insulation layer 135.

Specifically, the gate pad may be a pad configured to transmit the gate voltages to the plurality of subpixels SPX. The gate pad may be connected to the first connection line 181 through a contact hole. In addition, the gate voltage supplied from the first connection line 181 may be transmitted from the gate pad to the gate electrode of the switching transistor (not illustrated) through a line formed on the first plate pattern 121.

Further, the data pad may be a pad configured to transmit the data voltages to the plurality of subpixels SPX. The data pad may be connected to the second connection line 182 through a contact hole. In addition, the data voltage supplied from the second connection line 182 may be transmitted from the data pad to the source electrode of the switching transistor (not illustrated) through a line formed on the first plate pattern 121.

The voltage pad may be a pad configured to transmit the high-potential voltages to the plurality of subpixels SPX. The voltage pad may be connected to the first connection line 181 through a contact hole. In addition, the high-potential voltage supplied from the first connection line 181 may be transmitted from the voltage pad to the driving transistor 140 through a line formed on the first plate pattern 121. The high-potential voltage may also be referred to as a second drive voltage. The low-potential voltage to be described below may be referred to as a first drive voltage.

The gate pad, the data pad, and the voltage pad may be made of the same material as the source electrode 143 and the drain electrode 144. However, the present disclosure is not limited thereto.

The passivation layer 136 may be formed on the driving transistor 140. That is, the passivation layer 136 may be disposed to cover the driving transistor 140 to protect the driving transistor 140 from penetration of moisture and oxygen. The passivation layer 136 may be made of an inorganic material and configured as a single layer or multilayer. However, the present disclosure is not limited thereto.

In addition, the gate insulation layer 133, the first interlayer insulation layer 134, the second interlayer insulation layer 135, and the passivation layer 136 may be patterned and formed only in an area that overlaps the plurality of first plate patterns 121. Like the first buffer layer 131 and the second buffer layer 132, the gate insulation layer 133, the first interlayer insulation layer 134, the second interlayer insulation layer 135, and the passivation layer 136 may each be made of an inorganic material. For this reason, the display device 100 may easily crack and be damaged during the process of stretching the display device 100. Therefore, the gate insulation layer 133, the first interlayer insulation layer 134, the second interlayer insulation layer 135, and the passivation layer 136 may be formed only above the plurality of first plate patterns 121 by being patterned in the shapes of the plurality of first plate patterns 121 without being formed in the area between the plurality of first plate patterns 121.

The planarization layer 137 may be formed on the passivation layer 136. The planarization layer 137 may planarize an upper portion of the driving transistor 140. The planarization layer 137 may be configured as a single layer or a plurality of layers and made of an organic material. Therefore, the planarization layer 137 may be referred to as an organic insulation layer. For example, the planarization layer 137 may be made of an acrylic-based organic material. However, the present disclosure is not limited thereto.

With reference to FIG. 4A, the planarization layer 137 may be disposed on the plurality of first plate patterns 121 and cover top surfaces and side surfaces of the first buffer layer 131, the second buffer layer 132, the gate insulation layer 133, the first interlayer insulation layer 134, the second interlayer insulation layer 135, and the passivation layer 136. In addition, the planarization layer 137, together with the plurality of first plate patterns 121, may surround the first buffer layer 131, the second buffer layer 132, the gate insulation layer 133, the first interlayer insulation layer 134, the second interlayer insulation layer 135, and the passivation layer 136. More specifically, the planarization layer 137 may be disposed to partially cover top and side surfaces of the passivation layer 136, a side surface of the first interlayer insulation layer 134, a side surface of the second interlayer insulation layer 135, a side surface of the gate insulation layer 133, a side surface of the second buffer layer 132, a side surface of the first buffer layer 131, and top surfaces of the plurality of first plate patterns 121. Therefore, the planarization layer 137 may compensate for level differences between the side surfaces of the first buffer layer 131, the second buffer layer 132, the gate insulation layer 133, the first interlayer insulation layer 134, the second interlayer insulation layer 135, and the passivation layer 136. Further, the planarization layer 137 may increase bonding strength with the plurality of connection lines 181 and 182 disposed on the side surface of the planarization layer 137.

With reference to FIGS. 2, 3, and 4A, the plurality of connection lines 181 and 182 means lines that electrically connect the pads on the plurality of first plate patterns 121. The plurality of connection lines 181 and 182 may be disposed on the plurality of first line patterns 122. In addition, the first line pattern 122 is not disposed in an area in which the plurality of connection lines 181 and 182 is not disposed among the areas between the plurality of first plate patterns 121.

The plurality of connection lines 181 and 182 may include the first connection line 181 and the second connection line 182. The first connection line 181 and the second connection line 182 may be disposed between the plurality of first plate patterns 121. Specifically, the first connection line 181, among the plurality of connection lines 181 and 182, may mean a line disposed between the plurality of first plate patterns 121 and extending in the first direction X. The second connection line 182, among the plurality of connection lines 181 and 182, may mean a line disposed between the plurality of first plate patterns 121 and extending in the second direction Y.

The plurality of connection lines 181 and 182 may each be configured as a layered structure made of a metallic material such as copper (Cu), aluminum (Al), titanium (Ti), or molybdenum (Mo) or a metallic material such as copper/molybdenum-titanium (Cu/Moti) or titanium/aluminum/titanium (Ti/Al/Ti). However, the present disclosure is not limited thereto.

In the case of a general display panel of a display device, various lines such as a plurality of gate lines and a plurality of data lines are disposed between a plurality of subpixels and extend in straight shapes. The plurality of subpixels is connected to the single signal line. Therefore, in the case of the general display panel of the display device, various lines such as the gate line, the data line, the high-potential voltage line, and the reference voltage line may extend in a direction from one side to the other side of the display panel of the organic light-emitting display device without interruption on the substrate.

In contrast, in the case of the display device 100 according to the embodiment of the present disclosure, various lines such as gate lines, data lines, high-potential voltage lines, reference voltage lines, and initialization voltage lines, which are straight lines that may be considered as being used for the general display panel of the display device, may be disposed only on the plurality of first plate patterns 121. That is, in the display device 100 according to the embodiment of the present disclosure, the straight line may be disposed only on the plurality of first plate patterns 121.

In the display device 100 according to the embodiment of the present disclosure, the pads on the two adjacent first plate patterns 121 may be connected by the plurality of connection lines 181 and 182. Therefore, the plurality of connection lines 181 and 182 may electrically connect the gate pads, the data pads, or the voltage pads on the two adjacent first plate patterns 121. Therefore, the display device 100 according to the embodiment of the present disclosure may include the plurality of connection lines 181 and 182 to electrically connect various lines such as the gate lines, the data lines, the high-potential voltage lines, and the reference voltage lines between the plurality of first plate patterns 121. For example, the gate line may be disposed on the plurality of first plate patterns 121 disposed adjacent to one another in the first direction X, and the gate pads may be disposed at two opposite ends of the gate line. In this case, the plurality of gate pads on the plurality of first plate patterns 121 disposed adjacent to one another in the first direction X may be connected to one another by the first connection line 181 that serves as a gate line. Therefore, the gate line, which is disposed on the plurality of first plate patterns 121, and the first connection line 181, which is disposed on the first line pattern 122, may serve as a single gate line. The gate line may be referred to as a scan signal line. In addition, among all the various lines that may be included in the display device 100, the line extending in the first direction X, for example, the light-emitting signal line and the high-potential voltage line may also be electrically connected by the first connection line 181, as described above.

With reference to FIGS. 2, 3, and 4A, the first connection line 181 may connect the voltage pads on the two first plate patterns 121 disposed side by side, among the voltage pads on the plurality of first plate patterns 121 disposed adjacent to one another in the first direction X. The first connection line 181 may serve as the scan signal line and the light-emitting signal line that are the gate lines. However, the present disclosure is not limited thereto. The voltage pads on the plurality of first plate patterns 121 disposed in the first direction X may be connected by the first connection line 181 that serves as the high-potential voltage line, such that the single high-potential voltage may be transmitted.

In addition, the second connection line 182 may connect the data pads on the two first plate patterns 121 disposed side by side, among the data pads on the plurality of first plate patterns 121 disposed adjacent to one another in the second direction Y. The second connection line 182 may serve as the data line or the reference voltage line. However, the present disclosure is not limited thereto. Internal lines on the plurality of first plate patterns 121 disposed in the second direction Y may be connected by the plurality of second connection lines 182 that serves as the data lines, such that the single data voltage may be transmitted.

As illustrated in FIG. 4A, the first connection line 181 may be disposed to partially adjoin the top surface and the side surface of the planarization layer 137 disposed on the first plate pattern 121. Further, the first connection line 181 may extend from a top surface of a heat transfer gel 160 that is disposed on the first line pattern 122 and will be described below. In addition, the second connection line 182 may be disposed to adjoin the top surface and the side surface of the planarization layer 137 disposed on the first plate pattern 121. Further, the second connection line 182 may extend to the top surface of the heat transfer gel 160 that is disposed on the first line pattern 122 and will be described below.

However, because a rigid pattern need not be disposed in the area in which the first connection line 181 and the second connection line 182 are not disposed, the first line pattern 122, which is a rigid pattern, is not disposed below the first connection line 181 and the second connection line 182.

Meanwhile, with reference to FIG. 4A, a bank 138 may be formed on a connection pad 182, the plurality of connection lines 181 and 182, and the planarization layer 137. The bank 138 may separate the adjacent subpixels SPX. The bank 138 may be disposed to at least partially cover the connection pad 182, the plurality of connection lines 181 and 182, and the planarization layer 137. The bank 138 may be made of an insulating material. In addition, the bank 138 may include a black material. Because the bank 138 includes a black material, the bank 138 serves to cover the lines that may be visually recognized through the display area AA. For example, the bank 138 may be made of a carbon-based mixture. For example, the bank 138 may include carbon black. However, the present disclosure is not limited thereto. The bank 138 may be made of a transparent insulating material. Further, FIG. 4A illustrates that a height of the bank 138 is lower than a height of the light-emitting element 170. However, the present disclosure is not limited thereto. The height of the bank 138 may be equal to the height of the light-emitting element 170.

With reference to FIG. 4A, the light-emitting element 170 may be disposed on the connection pad 182. The light-emitting element 170 may include an n-type layer 171, an active layer 172, a p-type layer 173, an n-electrode 174, and a p-electrode 175. The light-emitting element 170 of the display device 100 according to the embodiment of the present disclosure may have a flip-chip structure having the n-electrode 174 and the p-electrode 175 formed on one surface thereof. However, the embodiment of the present disclosure is not limited thereto.

The n-type layer 171 may be formed by injecting n-type impurities into gallium nitride (GaN) having excellent crystallinity. The n-type layer 171 may also be disposed on a separate base substrate made of a material capable of emitting light.

The active layer 172 may be disposed on the n-type layer 171. The active layer 172 may be a light-emitting layer provided in the light-emitting element 170 and configured to emit light. The active layer 172 may be made of a nitride semiconductor, e.g., indium gallium nitride (InGaN). The p-type layer 173 may be disposed on the active layer 172. The p-type layer 173 may be formed by injecting p-type impurities into gallium nitride (GaN).

The light-emitting element 170 according to the embodiment of the present disclosure may be manufactured by sequentially stacking the n-type layer 171, the active layer 172, and the p-type layer 173 as described above, etching a selected (or pretermined) portion, and then forming the n-electrode 174 and the p-electrode 175. In this case, the selected (or pretermined) portion may be a space for spacing the n-electrode 174 and the p-electrode 175. The selected (or pretermined) portion may be etched so that a part of the n-type layer 171 is exposed. In other words, a surface of the light-emitting element 170, on which the n-electrode 174 and the p-electrode 175 are to be disposed, may be a surface having different height levels instead of a planarized surface.

The n-electrode 174 may be disposed in the area etched as described above. The n-electrode 174 may be made of an electrically conductive material. In addition, the p-electrode 175 may be disposed in a non-etched area. The p-electrode 175 may also be made of an electrically conductive material. For example, the n-electrode 174 may be disposed on the n-type layer 171 exposed by the etching process, and the p-electrode 175 may be disposed on the p-type layer 173. The p-electrode 175 may be made of the same material as the n-electrode 174.

A bonding layer AD may be disposed between the top surfaces of the connection pads 182 and between the connection pads 182, such that the light-emitting element 170 may be bonded onto the connection pads 182. In this case, the n-electrode 174 may be disposed on any one of the connection pads 182, and the p-electrode 175 may be disposed on one of the remaining connection pads 182.

The bonding layer AD may be a conductive bonding layer made by dispersing conductive balls into an insulating base member. Therefore, in case that heat or pressure is applied to the bonding layer AD, the conductive balls are electrically connected in a portion to which heat or pressure is applied, such that the bonding layer AD has conductive properties. An area, which is not pressed, may have insulation properties. For example, the n-electrode 174 may be electrically connected to any one of the connection pads 182 through the bonding layer AD, and the p-electrode 175 may be electrically connected to any one of the remaining connection pad 182 through the bonding layer AD. The connection pads 182 may be electrically connected to the p-electrode 175 and the n-electrode 174, respectively, by applying the bonding layer AD onto the connection pads 182 in an inkjet manner or the like, transferring the light-emitting element 170 onto the bonding layer AD, and pressing and heating the light-emitting element 170. However, the other portion of the bonding layer AD, except for a portion of the bonding layer AD disposed between any one of the n-electrode 174 and the p-electrode 175 and the connection pad 182, may have insulation properties. Meanwhile, the bonding layers AD, which are provided as separated layers, may be respectively disposed on the connection pads 182.

Further, any one of the connection pads 182 may be connected to any one of the plurality of first connection lines 181 and receive the low-potential voltage, which is used to operate the light-emitting element 170, from the power supply PS.

Further, one of the remaining connection pads 182 may be electrically connected to the drain electrode 144 of the driving transistor 140 and receive the drive voltage, which is used to operate the light-emitting element 170, from the driving transistor 140.

Therefore, when the display device 100 is turned on, the voltage with different levels respectively applied to the connection pads 182 may be respectively transmitted to the n-electrode 174 and the p-electrode 175, such that the light-emitting element 170 may emit light.

In addition, with reference to FIG. 4A, the filling layer 190 may be disposed on the front surface of the lower substrate 111 and fill portions between the constituent elements disposed on the upper substrate 112 and the lower substrate 111. The filling layer 190 may be made of a curable bonding agent. Specifically, the filling layer 190 may be formed by coating the front surface of the lower substrate 111 with a material, which constitutes the filling layer 190, and curing the material. The filling layer 190 may be disposed between the constituent elements disposed on the upper substrate 112 and the lower substrate 111. For example, the filling layer 190 may be an optically clear adhesive (OCA) and made of an acrylic-based bonding agent, a silicon-based bonding agent, a urethane-based bonding agent, and the like.

Meanwhile, with reference to FIG. 4A, the plurality of subpixels SPX may each include at least one trench structure. For example, as illustrated in FIG. 4A, the first plate pattern 121 and the first line pattern 122 disposed on the lower substrate 111 may each have the trench structure. Specifically, the first line patterns 122, which are disposed on the lower substrate 111 and disposed at two opposite sides of the first plate pattern 121, may have a higher height than the first plate pattern 121 disposed on the lower substrate 111 and disposed to correspond to each of the plurality of subpixels SPX. Therefore, the first plate pattern 121 and the first line pattern 122 disposed on the lower substrate 111 may have a level difference. As described above, one first plate pattern 121 and the first line patterns 122, which are disposed at the two opposite sides of the first plate pattern 121, may define one trench structure, and the plurality of subpixels SPX may each be disposed in one trench structure.

Meanwhile, FIG. 4A illustrates the structure in which the trench is defined because the first plate pattern 121 and the first line pattern 122 have a level difference. However, this configuration is provided for illustrative purposes only, and the embodiment of the present disclosure is not limited thereto. For example, in the lower substrate 111, a portion of the lower substrate 111 (e.g., the first lower pattern), which corresponds to an area in which the first plate pattern 121 is disposed, and a portion of the lower substrate 111 (e.g., the second lower pattern), which corresponds to an area in which the first line pattern 122 is disposed, may have a level difference, such that the trench structure may be formed.

Meanwhile, with reference to FIG. 4A, in case that the trench structure is formed and each of the plurality of subpixels SPX is disposed in the trench structure as described above, the level difference between the plurality of inorganic insulation layers, which is included in the subpixel SPX, and the other layered constituent elements, is compensated by the level difference defined by the trench structure, such that a level difference of the first connection line 181, which extends from the upper portion of the first line pattern 121 to the planarization layer 137 of the subpixel SPX, is reduced. That is, the level difference between the first connection line 181, which corresponds to the upper portion of the first line pattern 121, and the first connection line 181, which corresponds to the upper portion of the planarization layer 137 of the subpixel SPX, is reduced. Therefore, it is possible to improve the reliability of signal transmission through the first connection line 181 and the reliability related to the flexibility of the first connection line 181.

In addition, in case that each of the plurality of subpixels SPX is disposed in the trench structure, a contact surface area between the trench structure and the subpixel SPX may increase, such that the effect of dissipating heat generated from the subpixel SPX may be improved.

In the embodiment, with reference to FIGS. 2, 3, and 4A, the display device 100 may include a plurality of heat transfer patterns disposed in an area (e.g., a first area) of the lower substrate 111, in which the plurality of subpixels SPX is disposed, and configured to overlap the plurality of subpixels SPX, respectively. Specifically, the plurality of heat transfer patterns may be disposed inside and/or outside each of the plurality of subpixels SPX and include a metallic material. In case that the plurality of heat transfer patterns disposed inside and/or outside each of the plurality of subpixels SPX includes a metallic material as described above, the heat generated from the plurality of subpixels SPX may be discharged through the heat transfer patterns. Therefore, it is possible to improve the heat dissipation effect of the display device 100.

For example, the plurality of heat transfer patterns may include inner heat transfer patterns disposed inside each of the plurality of subpixels SPX, and outer heat transfer patterns disposed outside each of the plurality of subpixels SPX.

In the embodiment, the inner heat transfer pattern may include a first inner heat transfer pattern IHT1.

Specifically, with reference to FIGS. 3 and 4A, the first inner heat transfer pattern IHT1 may be disposed on the same layer as the shield metal layer 145 of the driving transistor 140 and disposed to be spaced apart from the shield metal layer 145. That is, the first inner heat transfer pattern IHT1 may be disposed on the first buffer layer 131 and disposed to be spaced apart from the shield metal layer 145.

The first inner heat transfer pattern IHT1 may include a metallic material. For example, the first inner heat transfer pattern IHT1 may include a metallic material such as molybdenum (Mo) or titanium (Ti). According to the embodiment, the first inner heat transfer pattern IHT1 may be configured as a single layer or multilayer made of any one of metallic materials such as molybdenum (Mo) and titanium (Ti) or an alloy thereof. However, this configuration is provided for illustrative purposes only, and the metallic material included in the first inner heat transfer pattern IHT1 is not limited thereto.

According to the embodiment, the first inner heat transfer pattern IHT1 and the shield metal layer 145 of the driving transistor 140 may include the same material. In this case, the first inner heat transfer pattern IHT1 and the shield metal layer 145 of the driving transistor 140 may be simultaneously formed by the same process. In this case, the first inner heat transfer pattern IHT1 may be formed by means of a design area used for the process of forming the shield metal layer 145, which may be more advantageous in terms of spatial efficiency.

In addition, the first inner heat transfer pattern IHT1 and the shield metal layer 145 of the driving transistor 140 are disposed on the same layer, such that the first inner heat transfer pattern IHT1 may be positioned at a lowermost end of the layered structure of the subpixel SPX. Therefore, the first inner heat transfer pattern IHT1 may be more easily connected, through a contact hole, to a first outer heat transfer pattern OHT1 that is positioned below the subpixel SPX and will be described below.

In addition, as described above, in case that the first inner heat transfer pattern IHT1 includes a metallic material (e.g., molybdenum (Mo), titanium (Ti), or the like) having low resistance, the display device 100 may be manufactured by increasing a resistance path in the first inner heat transfer pattern IHT1 during the process of manufacturing the display device 100. In this case, in case that a voltage of any one of the plurality of heat transfer patterns (e.g., the inner heat transfer pattern and/or the outer heat transfer pattern) is measured by a voltage sensing circuit (e.g., a voltage sensing circuit included in the first printed circuit board PCB1) to be described below and/or in case that a voltage feedback circuit (e.g., a voltage feedback circuit included in the second printed circuit board PCB2) to be described below applies a feedback voltage to another of the plurality of heat transfer patterns (e.g., the inner heat transfer pattern and/or the outer heat transfer pattern) on the basis of feedback of the measured voltage, a voltage drop in the first inner heat transfer pattern IHT1 may be reduced or minimized, which may be more advantageous in compensating for a temperature, as described below.

However, the embodiment of the present disclosure is not limited thereto. The first inner heat transfer pattern IHT1 may include a metallic material having higher resistance than the metallic material included in the shield metal layer 145. For example, the first inner heat transfer pattern IHT1 may include a metallic material such as platinum (Pt) or nickel (Ni). According to the embodiment, the first inner heat transfer pattern IHT1 may be configured as a single layer or multilayer made of any one of metallic materials such as platinum (Pt) and nickel (Ni) or an alloy thereof. However, this configuration is provided for illustrative purposes only, and the metallic material included in the first inner heat transfer pattern IHT1 is not limited thereto.

As described above, the first inner heat transfer pattern IHT1 includes a metallic material having relatively high resistance, such that the heat generated from the inside of the subpixel SPX may be more effectively dissipated.

In the embodiment, the outer heat transfer patterns may include the first outer heat transfer pattern OHT1 and a plurality of second outer heat transfer patterns OHT2.

Specifically, with reference to FIG. 4A, the first outer heat transfer pattern OHT1 may be disposed in parallel with each of the plurality of subpixels SPX. For example, the first outer heat transfer pattern OHT1 may be disposed below the plurality of subpixels SPX, disposed on the first plate pattern 121, and disposed in parallel with each of the plurality of subpixels SPX. In this case, the first outer heat transfer pattern OHT1 may be disposed to correspond to the area in which the first plate pattern 121 is disposed.

In addition, the plurality of second outer heat transfer patterns OHT2 may be disposed to be perpendicular to each of the plurality of subpixels SPX. For example, the second outer heat transfer pattern OHT2 may be disposed below the plurality of subpixels SPX, disposed on the first plate pattern 121, and disposed to be perpendicular to each of the plurality of subpixels SPX. In this case, like the first outer heat transfer pattern OHT1, the second outer heat transfer pattern OHT2 may be disposed to correspond to the area in which the first plate pattern 121 is disposed.

In the embodiment, the first outer heat transfer pattern OHT1 may be in contact with at least one of the plurality of second outer heat transfer patterns OHT2. For example, the first outer heat transfer pattern OHT1 may be in contact with all the plurality of second outer heat transfer patterns OHT2. For example, the first outer heat transfer pattern OHT1 and the plurality of second outer heat transfer patterns OHT2 may be integrated. However, the embodiment of the present disclosure is not limited thereto. The first outer heat transfer pattern OHT1 and the plurality of second outer heat transfer patterns OHT2 may be separately manufactured and then electrically connected to one another.

In addition, the first inner heat transfer pattern IHT1 may be electrically connected to the outer heat transfer pattern. For example, the first inner heat transfer pattern IHT1 may be electrically connected to the outer heat transfer pattern by being brought into contact with the first outer heat transfer pattern OHT1, which is disposed in parallel with the subpixel SPX, through contact holes (e.g., first insulation contact holes) at least partially formed through the first buffer layer 131 and the heat transfer gel 160. Therefore, the heat generated from each of the plurality of subpixels SPX may be discharged through the first inner heat transfer pattern IHT1 and the outer heat transfer patterns (e.g., the first outer heat transfer pattern OHT1 and the second outer heat transfer pattern OHT2) connected to the first inner heat transfer pattern IHT1.

The first outer heat transfer pattern OHT1 and the plurality of second outer heat transfer patterns OHT2 may include a metallic material.

For example, the first outer heat transfer pattern OHT1 and the plurality of second outer heat transfer patterns OHT2 may include a metallic material such as molybdenum (Mo) or titanium (Ti). According to the embodiment, the first outer heat transfer pattern OHT1 and the plurality of second outer heat transfer patterns OHT2 may each be configured as a single layer or multilayer made of any one of metallic materials such as molybdenum (Mo) and titanium (Ti) or an alloy thereof. However, this configuration is provided for illustrative purposes only, and the metallic materials included in the first outer heat transfer pattern OHT1 and the plurality of second outer heat transfer patterns OHT2 are not limited thereto.

As described above, in case that the first outer heat transfer pattern OHT1 and the plurality of second outer heat transfer patterns OHT2 include a metallic material (e.g., molybdenum (Mo), titanium (Ti), or the like) having low resistance, the display device 100 may be manufactured by increasing resistance paths in the first outer heat transfer pattern OHT1 and the plurality of second outer heat transfer patterns OHT2 during the process of manufacturing the display device 100. In this case, in case that a voltage of any one of the plurality of heat transfer patterns (e.g., the inner heat transfer pattern and/or the outer heat transfer pattern) is measured by the voltage sensing circuit (e.g., the voltage sensing circuit included in the first printed circuit board PCB1) to be described below and/or in case that the voltage feedback circuit (e.g., the voltage feedback circuit included in the second printed circuit board PCB2) to be described below applies a feedback voltage to another of the plurality of heat transfer patterns (e.g., the inner heat transfer pattern and/or the outer heat transfer pattern) on the basis of feedback of the measured voltage, voltage drops in the first outer heat transfer pattern OHT1 and the plurality of second outer heat transfer patterns OHT2 may be reduced or minimized, which may be more advantageous in compensating for a temperature.

In addition, in case that the first inner heat transfer pattern IHT1 and the first outer heat transfer pattern OHT1 and the plurality of second outer heat transfer patterns OHT2, which are electrically connected to the first inner heat transfer pattern IHT1, all include a metallic material (e.g., molybdenum (Mo), titanium (Ti), or the like) having relatively low resistance, the resistance may be decreased, the voltage drop may be reduced or minimized, and the voltage uniformity may be improved, such that the temperature uniformity may also be improved.

However, the embodiment of the present disclosure is not limited thereto. The first outer heat transfer pattern OHT1 and the plurality of second outer heat transfer patterns OHT2 may include a metallic material having relatively high resistance. For example, the first outer heat transfer pattern OHT1 and the plurality of second outer heat transfer patterns OHT2 may include a metallic material such as platinum (Pt) or nickel (Ni). According to the embodiment, the first outer heat transfer pattern OHT1 and the plurality of second outer heat transfer patterns OHT2 may each be configured as a single layer or multilayer made of any one of metallic materials such as platinum (Pt) and nickel (Ni) or an alloy thereof. However, this configuration is provided for illustrative purposes only, and the metallic materials included in the first outer heat transfer pattern OHT1 and the plurality of second outer heat transfer patterns OHT2 are not limited thereto.

As described above, the first outer heat transfer pattern OHT1 and the plurality of second outer heat transfer patterns OHT2 include a metallic material having relatively high resistance, such that the heat generated from the subpixel SPX may be more effectively dissipated.

In the embodiment, with reference to FIGS. 2, 3, and 4A, the display device 100 may include a plurality of heat transfer lines respectively connected to the plurality of heat transfer patterns and disposed in an area (e.g., a second area) of the display area AA of the lower substrate 111, except for the area in which the plurality of subpixels SPX is disposed.

Figure 5A:
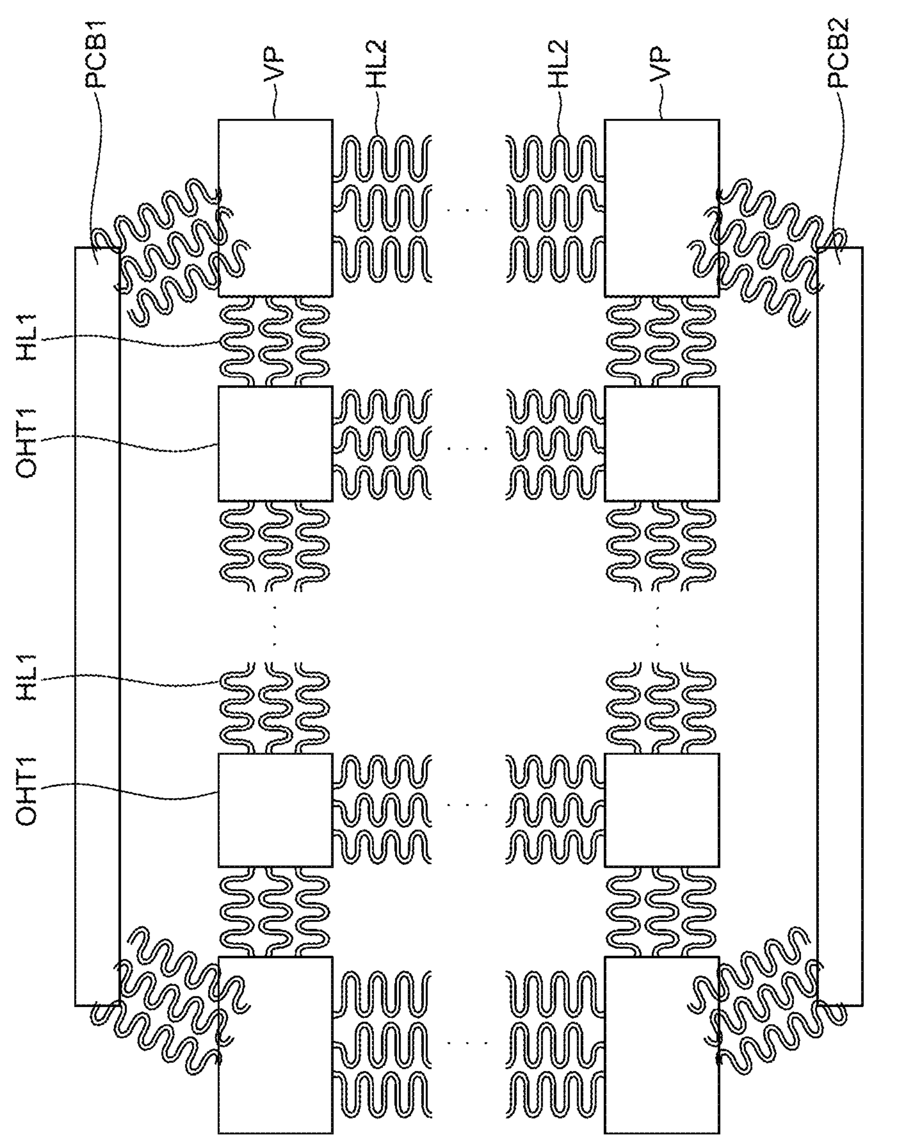
FIG. 5A is a view for explaining an example of a connection relationship between a printed circuit board, a power pad, and an insulation pattern included in the display device in FIG. 1.

More specifically, the plurality of heat transfer lines may include a plurality of first heat transfer lines HL1 and a plurality of second heat transfer lines HL2 (see FIG. 5A). In this case, in the display area AA, the plurality of first heat transfer lines HL1 may each connect the outer heat transfer patterns among the plurality of heat transfer patterns, e.g., the adjacent first outer heat transfer patterns OHT1. Meanwhile, in the non-display area NA, the plurality of second heat transfer lines HL2 (see FIG. 5A) may each connect the printed circuit board and a plurality of power patterns VP (see FIG. 5A).

For example, as illustrated in FIG. 4A, the plurality of first heat transfer lines HL1 may each extend from the top surface of the first line pattern 122 and be in contact with two opposite ends of the first outer heat transfer pattern OHT1, such that the plurality of first heat transfer lines HL1 may each be electrically connected to the first outer heat transfer pattern OHT1.

In addition, in the embodiment, with reference to FIG. 4A, the display device 100 may further include the heat transfer gel 160. Specifically, the heat transfer gel 160 may be disposed in a shape corresponding to the above-mentioned trench structure. For example, the heat transfer gel 160 may be disposed above the first plate pattern 121 and the second plate patterns 122 and formed over the front surface of the display area AA while corresponding to the top surface of the first plate pattern 121 and the top surfaces of the second plate patterns 122.

More specifically, the heat transfer gel 160 may be disposed between the first outer heat transfer pattern OHT1 and each of the plurality of subpixels SPX. For example, at least a part of the heat transfer gel 160 may be disposed between the subpixels SPX adjacent to the first outer heat transfer pattern OHT1. In addition, the heat transfer gel 160 may be disposed between the plurality of connection lines and the plurality of heat transfer lines. For example, at least a part of the heat transfer gel 160 may be disposed between the first connection line 181 and the first heat transfer line HL1. In addition, the heat transfer gel 160 may be disposed between the planarization layer 137, a bottom surface of the first buffer layer 131, and a top surface of the first outer heat transfer pattern OHT1 and extend on the first outer heat transfer pattern OHT1.

The heat transfer gel 160 may include an insulating material. For example, the heat transfer gel 160 may include silicon (Si) or the like. However, the present disclosure is not limited thereto. Because the heat transfer gel 160 including an insulating material is disposed as described above, the heat transfer gel 160 may insulate the plurality of subpixels SPX and the plurality of heat transfer lines (e.g., the first heat transfer line HL1). The heat transfer gel 160 includes a material having excellent flexibility and adhesiveness and a low clastic modulus, such that the heat transfer gel 160 may be more effectively and tightly attached to a concave-convex surface and more effectively transfer heat. Therefore, it is possible to improve the heat dissipation effect.

In addition, in the embodiment, the outer heat transfer patterns may further include a plurality of third outer heat transfer patterns OHT3.

More specifically, with reference further to FIG. 4B, the third outer heat transfer pattern OHT3 may be disposed in parallel with each of the plurality of subpixels SPX. For example, the third outer heat transfer patterns OHT3 may be disposed below the plurality of subpixels SPX and disposed in the first plate pattern 121. In addition, the third outer heat transfer patterns OHT3 may be disposed to traverse the plurality of second outer heat transfer patterns OHT2 and electrically connect the plurality of second outer heat transfer patterns OHT2.

The third outer heat transfer pattern OHT3 may include a metallic material.

For example, the third outer heat transfer pattern OHT3 may include a metallic material such as molybdenum (Mo) or titanium (Ti). According to the embodiment, the third outer heat transfer pattern OHT3 may be configured as a single layer or multilayer made of any one of metallic materials such as molybdenum (Mo) and titanium (Ti) or an alloy thereof. However, this configuration is provided for illustrative purposes only, and the metallic material included in the third outer heat transfer pattern OHT3 is not limited thereto.

As described above, in case that the third outer heat transfer pattern OHT3 includes a metallic material (e.g., molybdenum (Mo), titanium (Ti), or the like) having low resistance, the display device 100 may be manufactured by increasing a resistance path in the third outer heat transfer pattern OHT3 during the process of manufacturing the display device 100. In this case, in case that a voltage of any one of the plurality of heat transfer patterns (e.g., the inner heat transfer pattern and/or the outer heat transfer pattern) is measured by the voltage sensing circuit (e.g., the voltage sensing circuit included in the first printed circuit board PCB1) to be described below and/or in case that the voltage feedback circuit (e.g., the voltage feedback circuit included in the second printed circuit board PCB2) to be described below applies a feedback voltage to another of the plurality of heat transfer patterns (e.g., the inner heat transfer pattern and/or the outer heat transfer pattern) on the basis of feedback of the measured voltage, a voltage drop in the third outer heat transfer pattern OHT3 may be reduced or minimized, which may be more advantageous in compensating for a temperature.

In addition, in case that the first inner heat transfer pattern IHT1, the first outer heat transfer pattern OHT1 and the plurality of second outer heat transfer patterns OHT2, which are electrically connected to the first inner heat transfer pattern IHT1, and the third outer heat transfer pattern OHT3, which is electrically connected to the plurality of second outer insulation patterns OHT2, all include a metallic material (e.g., molybdenum (Mo), titanium (Ti), or the like) having relatively low resistance, the resistance may be decreased, the voltage drop may be reduced or minimized, and the voltage uniformity may be improved, such that the temperature uniformity may also be improved.

However, the embodiment of the present disclosure is not limited thereto. The third outer heat transfer pattern OHT3 may include a metallic material having relatively high resistance. For example, the third outer heat transfer pattern OHT3 may include a metallic material such as platinum (Pt) or nickel (Ni). According to the embodiment, the third outer heat transfer pattern OHT3 may be configured as a single layer or multilayer made of any one of metallic materials such as platinum (Pt) and nickel (Ni) or an alloy thereof. However, this configuration is provided for illustrative purposes only, and the metallic material included in the third outer heat transfer pattern OHT3 is not limited thereto.

As described above, the third outer heat transfer pattern OHT3 includes a metallic material having relatively high resistance, such that the heat generated from the subpixel SPX may be more effectively dissipated.

Hereinafter, the voltage sensing circuit, which is included in the first printed circuit board PCB1, and the voltage feedback circuit, which is included in the second printed circuit board PCB2, will be described more specifically with reference further to FIGS. 5A and 5B.

FIG. 5A is a view for explaining an example of a connection relationship between a printed circuit board, a power pad, and an insulation pattern included in the display device in FIG. 1.

Figure 5B:
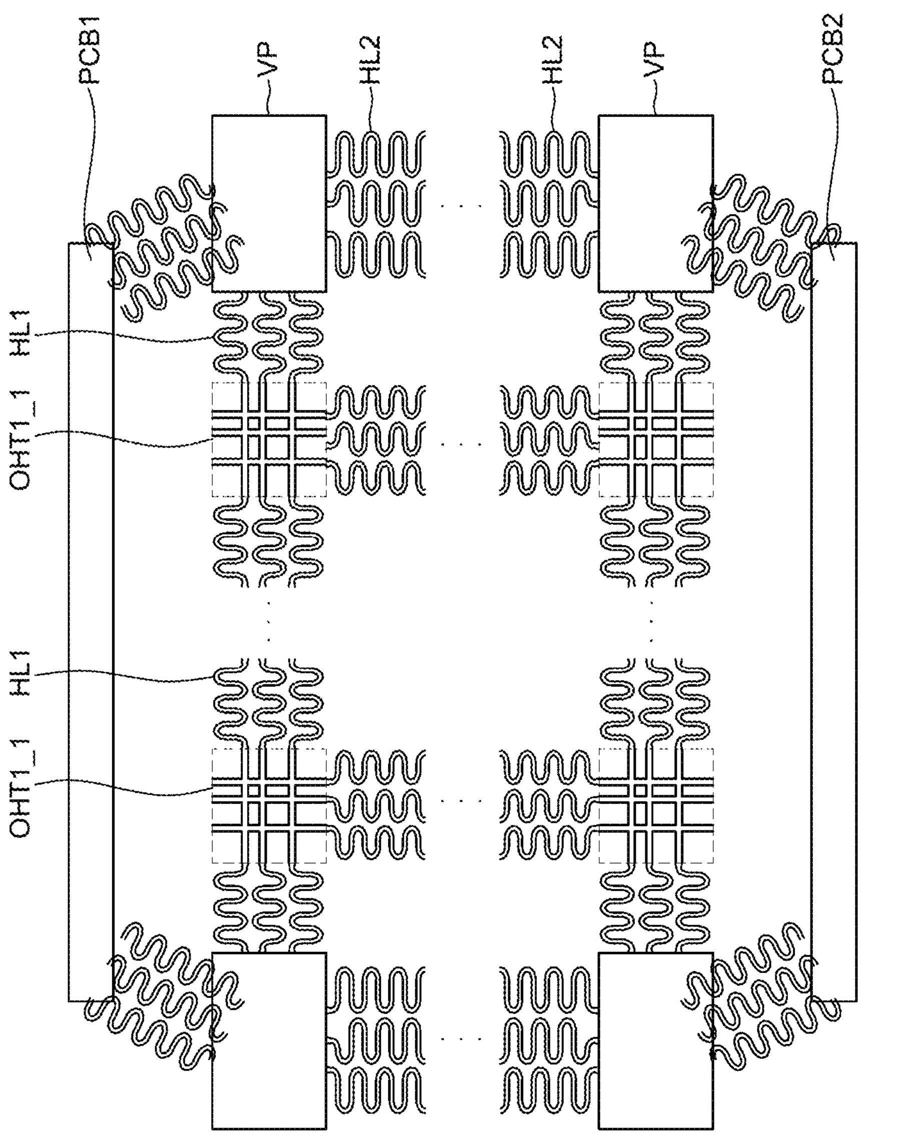
FIG. 5B is a view for explaining another example of the connection relationship between the printed circuit board, the power pad, and the insulation pattern included in the display device in FIG. 1.

FIG. 5B is a view for explaining another example of the connection relationship between the printed circuit board, the power pad, and the insulation pattern included in the display device in FIG. 1.

With reference to FIGS. 1, 2, 4A, and 5A, the display device 100 according to the embodiment of the present disclosure may include the plurality of first outer insulation patterns OHT1 and the plurality of first heat transfer lines HL1 disposed in the display area AA, and the printed circuit boards (e.g., the first printed circuit board PCB1 and the second printed circuit board PCB2), the power patterns VP, and the second heat transfer lines HL2 disposed in the non-display area NA.

In the embodiment, in the display area AA, the plurality of first outer insulation patterns OHT1 may be disposed in the form of islands spaced apart from one another. The plurality of first heat transfer lines HL1 may connect the plurality of first outer insulation patterns OHT1 disposed in the display area AA.

The plurality of first outer heat transfer patterns OHT1 may be individually separated. For example, as illustrated in FIG. 5A, the plurality of first outer heat transfer patterns OH1 may each be a plate shape when viewed in a plan view.

However, a planar shape of the first outer heat transfer pattern OHT1 is not limited thereto. For example, with reference to FIG. 5B, a plurality of first outer heat transfer patterns OHT1_1 may each be a matrix shape (or mesh shape) when viewed in a plan view. In case that the first outer heat transfer pattern OHT1_1 has the planar shape, e.g., the matrix shape (or mesh shape) as described above and in case that a voltage of any one of the plurality of heat transfer patterns (e.g., the first outer heat transfer pattern OHT1_1) is measured by the voltage sensing circuit (e.g., the voltage sensing circuit included in the first printed circuit board PCB1) to be described below and/or in case that the voltage feedback circuit (e.g., the voltage feedback circuit included in the second printed circuit board PCB2) to be described below applies a feedback voltage to another of the plurality of heat transfer patterns (e.g., the first outer heat transfer pattern OHT1_1) on the basis of feedback of the measured voltage, the voltage uniformity in the first outer heat transfer pattern OHT1_1 may be improved when the voltage is measured or the feedback voltage is applied through the first outer heat transfer pattern OHT1_1.

With reference back to FIG. 5A, in the non-display area NA, the plurality of power patterns VP may be disposed in the form of islands spaced apart from one another. The plurality of second heat transfer lines HL2 may connect the plurality of power patterns VP disposed in the non-display area NA.

For example, at least some of the plurality of power patterns VP are disposed in a row in the non-display area NA at one side of the display area AA and spaced apart from one another. Some of the remaining power patterns VP may be disposed in a row in the non-display area NA at the other side of the display area AA and spaced apart from one another. For example, at least some of the plurality of power patterns VP and some of the remaining power patterns VP may be disposed to be spaced apart from one another so as to respectively correspond to the columns in which the first outer heat transfer patterns OHT1 are disposed.

The plurality of second heat transfer lines HL2 may connect the plurality of power patterns VP disposed in the non-display area NA. In addition, at least some of the plurality of second heat transfer lines HL2 may connect the power patterns VP, which are positioned at uppermost ends among the plurality of power patterns VP, to the first printed circuit board PCB1 (e.g., the voltage sensing circuit disposed on the first printed circuit board PCB1). At least some of the remaining second heat transfer lines HL2 may connect the power patterns VP, which are positioned at lowermost ends among the plurality of power patterns VP, to the second printed circuit board PCB2 (e.g., the voltage feedback circuit disposed on the first printed circuit board PCB2).

Meanwhile, as described above, the plurality of subpixels SPX may generate heat, and the temperatures of the subpixels SPX may be increased, which may degrade the reliability. Furthermore, the temperature of the subpixel SPX may be decreased to be lower than a reference value (e.g., room temperature) because of factors such as external environments, which may degrade the reliability. In this case, it is beneficial to increase the temperature of the subpixel SPX (e.g., the inside and/or outside of the subpixel SPX) by the reference value to allow the subpixel SPX to operate normally. Therefore, it may be beneficial to compensate for the temperature of the subpixel SPX in order to increase the temperature of the subpixel SPX by the reference value.

To this end, in the embodiment, the voltage sensing circuit may be disposed on the first printed circuit board PCB1 (or the first printed circuit board PCB1 may include the voltage sensing circuit), and the voltage feedback circuit may be disposed on the second printed circuit board PCB2 (or the second printed circuit board PCB2 may include the voltage feedback circuit).

More specifically, the voltage sensing circuit disposed on the first printed circuit board PCB1 may measure a voltage of any one of the plurality of heat transfer patterns. For example, the voltage sensing circuit may be connected to any one of the power patterns VP (e.g., the power pattern VP disposed at the uppermost end) through the second heat transfer line HL2. In this case, the voltage sensing circuit may be electrically connected to the plurality of first outer heat transfer patterns OHT1 through the power patterns VP, which are connected through the second heat transfer lines HL2, and the first heat transfer lines HL1, which are connected to the power patterns VP, and the voltage sensing circuit may measure voltages of the plurality of first outer heat transfer patterns OHT1. For example, the voltage sensing circuit may measure a voltage of the first outer heat transfer pattern OHT1 positioned at the uppermost end among the plurality of first outer heat transfer patterns OHT1.

In addition, the voltage feedback circuit disposed on the second printed circuit board PCB2 may provide feedback on the voltage measured by the voltage sensing circuit and apply a feedback voltage to another of the plurality of heat transfer patterns. For example, the voltage feedback circuit may be connected to another of the power patterns VP (e.g., the power pattern VP disposed at the lowermost end) through the second heat transfer line HL2. In this case, the voltage feedback circuit may be electrically connected to the plurality of first outer heat transfer patterns OHT1 through the power patterns VP, which are connected through the second heat transfer lines HL2, and the first heat transfer lines HL1, which are connected to the power patterns VP, and the voltage feedback circuit may apply feedback voltages of the plurality of first outer heat transfer patterns OHT1.

More specifically, the display device 100 according to the embodiment of the present disclosure may determine that the temperatures of the plurality of subpixels SPX are lower than the reference value in case that the voltage measured by the voltage sensing circuit of the first printed circuit board PCB1 is lower than a reference voltage, and the display device 100 may apply the feedback voltages to the plurality of heat transfer patterns, e.g., the plurality of first outer heat transfer patterns OHT1 by using the voltage feedback circuit of the second printed circuit board PCB2 in order to provide feedback on the measured voltage.

As described above, in case that the feedback voltages are applied to the plurality of first outer heat transfer patterns OHT1, heat is generated from the first outer heat transfer pattern OHT1, which includes a metallic material, and the first inner heat transfer pattern IHT1 and the second outer heat transfer pattern OHT2 (or the first inner heat transfer pattern IHT1, the second outer heat transfer pattern OHT2, and the third outer heat transfer pattern OHT3), which are electrically connected to the first outer heat transfer pattern OHT1 and include a metallic material, such that the temperatures of the plurality of subpixels SPX may be increased by the reference value. Therefore, the temperature of the subpixel SPX (e.g., the inside and/or outside of the subpixel SPX) is compensated, which may allow the plurality of subpixels SPX to operate normally.

Meanwhile, the plurality of first heat transfer lines HL1 and the plurality of second heat transfer lines HL2 may include a metallic material. For example, the plurality of first heat transfer lines HL1 and the plurality of second heat transfer lines HL2 may include a metallic material having relatively high resistance. For example, the plurality of first heat transfer lines HL1 and the plurality of second heat transfer lines HL2 may include a metallic material such as platinum (Pt) or nickel (Ni). According to the embodiment, the plurality of first heat transfer lines HL1 and the plurality of second heat transfer lines HL2 may each be configured as a single layer or multilayer made of any one of metallic materials such as platinum (Pt) and nickel (Ni) or an alloy thereof. However, this configuration is provided for illustrative purposes only, and the metallic materials included in the plurality of first heat transfer lines HL1 and the plurality of second heat transfer lines HL2 are not limited thereto.

In case that the plurality of first heat transfer lines HL1 and the plurality of second heat transfer lines HL2 include a metallic material having relatively high resistance as described above, the temperatures are increased even in the plurality of first heat transfer lines HL1 and the plurality of second heat transfer lines HL2 by the application of the feedback voltages, such that the temperature compensation may be more effectively performed.

Meanwhile, the embodiment has been described above in which the plurality of inner heat transfer patterns includes only the first inner heat transfer pattern IHT1 disposed on the same layer as the shield metal layer 145 of the driving transistor 140. However, the embodiment of the present disclosure is not limited thereto. The plurality of inner heat transfer patterns may further include a second inner heat transfer pattern IHT2 (see FIG. 9A) disposed on the same layer as the gate electrode 141 of the driving transistor 140, and/or a third inner heat transfer pattern IHT3 (see FIG. 9A) disposed on the same layer as the intermediate metal layer IM. Hereinafter, this configuration will be described more specifically with reference to FIGS. 6 to 9B.

Figure 6:
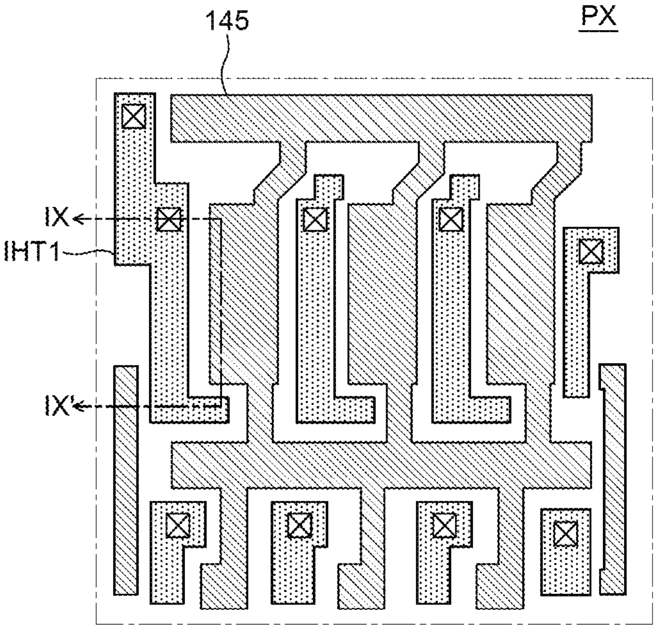
FIG. 6 is an enlarged top plan view illustrating an example of the area in which the pixel included in the display device in FIG. 2 is disposed.

FIG. 6 is an enlarged top plan view illustrating an example of the area in which the pixel included in the display device in FIG. 2 is disposed.

Figure 7:
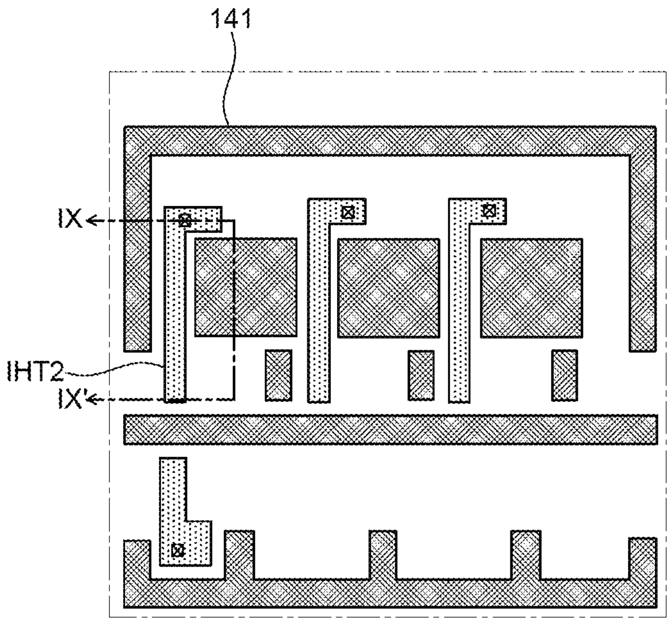
FIG. 7 is an enlarged top plan view illustrating an example of the area in which the pixel included in the display device in FIG. 2 is disposed.

FIG. 7 is an enlarged top plan view illustrating an example of the area in which the pixel included in the display device in FIG. 2 is disposed.

Figure 8:
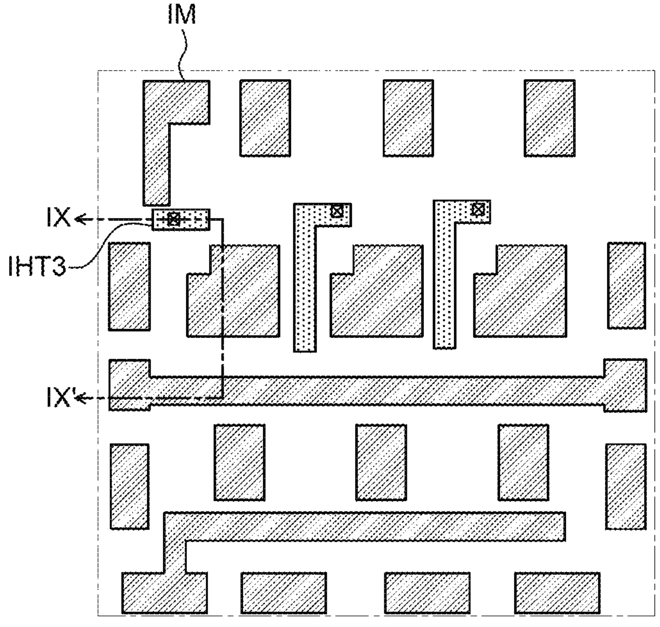
FIG. 8 is an enlarged top plan view illustrating an example of the area in which the pixel included in the display device in FIG. 2 is disposed.

FIG. 8 is an enlarged top plan view illustrating an example of the area in which the pixel included in the display device in FIG. 2 is disposed.

Figure 9A:
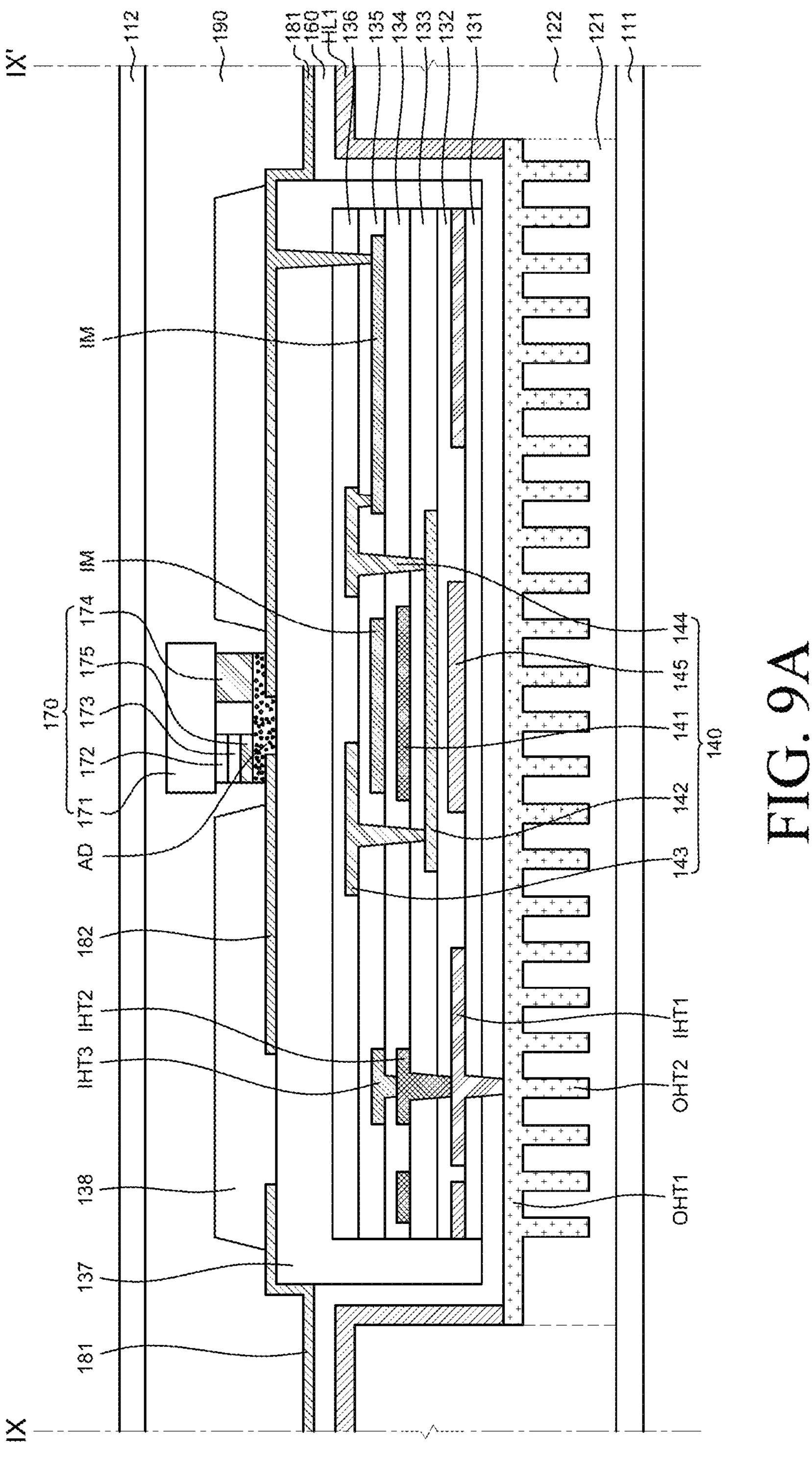
FIG. 9A is a cross-sectional view illustrating an example taken along cutting line IX-IX' illustrated in FIGS. 6 to 8.

FIG. 9A is a cross-sectional view illustrating an example taken along cutting line IX-IX' illustrated in FIGS. 6 to 8.

Figure 9B:
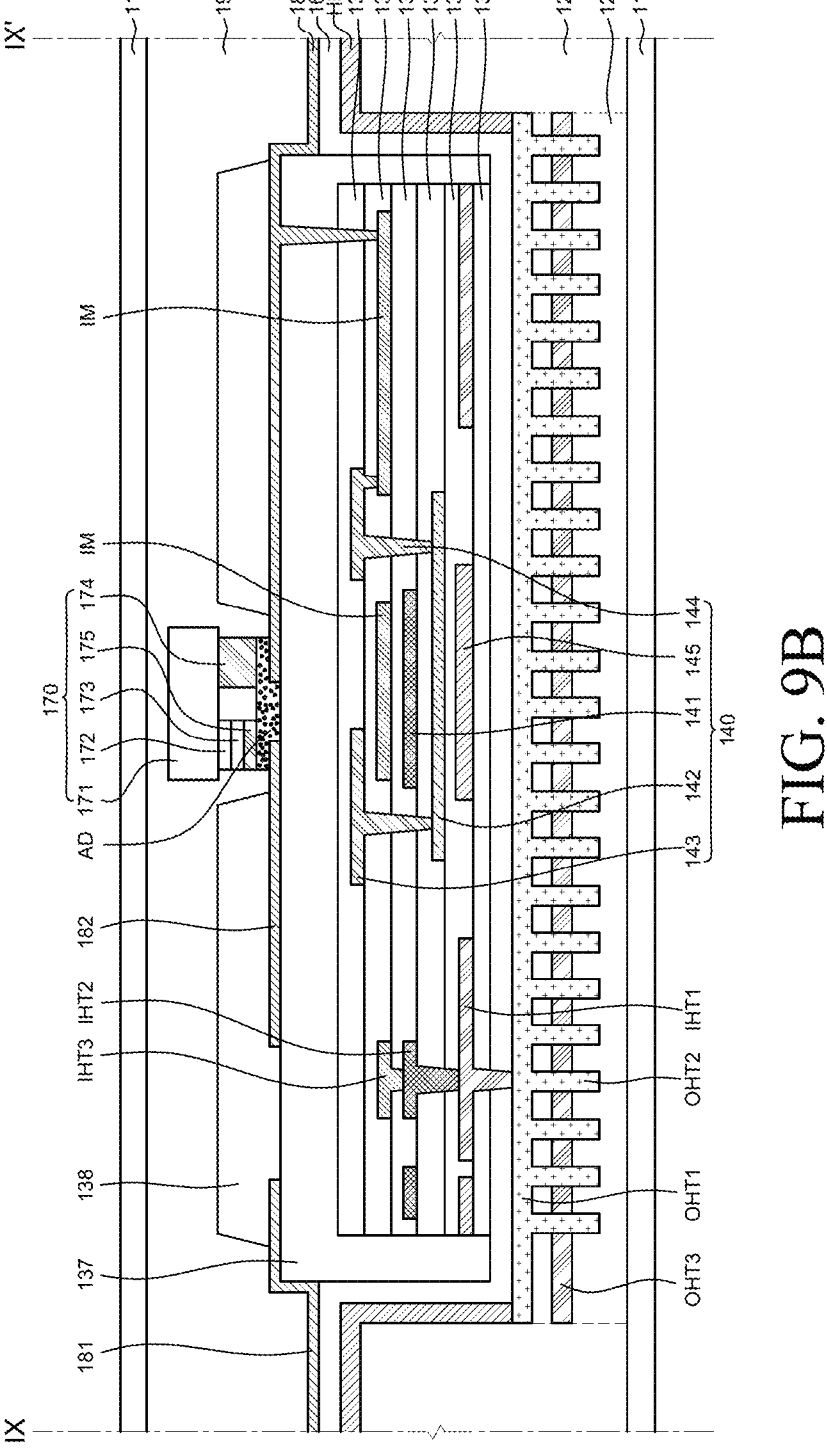
FIG. 9B is a cross-sectional view illustrating an example taken along cutting line IX-IX' illustrated in FIGS. 6 to 8.

FIG. 9B is a cross-sectional view illustrating an example taken along cutting line IX-IX' illustrated in FIGS. 6 to 8.

With reference to FIGS. 6, 9A, and 9B, as described above with reference to FIGS. 1 to 5B, the inner heat transfer patterns may include the first inner heat transfer pattern IHT1 disposed on the same layer as the shield metal layer 145 of the driving transistor 140 and disposed to be spaced apart from the shield metal layer 145.

In addition, with reference to FIGS. 7, 9A, and 9B, the inner heat transfer patterns may further include the second inner heat transfer pattern IHT2 disposed on the same layer as the gate electrode 141 of the driving transistor 140 and disposed to be spaced apart from the gate electrode 141.

The second inner heat transfer pattern IHT2 may be in contact with the first inner heat transfer pattern IHT1 through contact holes (e.g., second insulation contact holes) at least partially formed through the gate insulation layer 133 and the second buffer layer 132. Therefore, the second inner heat transfer pattern IHT2 may be electrically connected to the first inner heat transfer pattern IHT1.

The second inner heat transfer pattern IHT2 may include a metallic material. For example, the second inner heat transfer pattern IHT2 may include a metallic material such as molybdenum (Mo) or titanium (Ti). According to the embodiment, the second inner heat transfer pattern IHT2 may be configured as a single layer or multilayer made of any one of metallic materials such as molybdenum (Mo) and titanium (Ti) or an alloy thereof. However, this configuration is provided for illustrative purposes only, and the metallic material included in the second inner heat transfer pattern IHT2 is not limited thereto.

According to the embodiment, the second inner heat transfer pattern IHT2 and the gate electrode 141 of the driving transistor 140 may include the same material. In this case, the second inner heat transfer pattern IHT2 and the gate electrode 141 of the driving transistor 140 may be simultaneously formed by the same process. In this case, the second inner heat transfer pattern IHT2 may be formed by means of a design area used for the process of forming the gate electrode 141, which may be more advantageous in terms of spatial efficiency.

In addition, as described above, in case that the second inner heat transfer pattern IHT2 includes a metallic material (e.g., molybdenum (Mo), titanium (Ti), or the like) having low resistance, the display device 100 may be manufactured by increasing a resistance path in the second inner heat transfer pattern IHT2 during the process of manufacturing the display device 100. In this case, in case that a voltage of any one of the plurality of heat transfer patterns (e.g., the inner heat transfer pattern and/or the outer heat transfer pattern) is measured by the voltage sensing circuit (e.g., the voltage sensing circuit included in the first printed circuit board PCB1) and/or in case that the voltage feedback circuit (e.g., the voltage feedback circuit included in the second printed circuit board PCB2) to be described below applies a feedback voltage to another of the plurality of heat transfer patterns (e.g., the inner heat transfer pattern and/or the outer heat transfer pattern) on the basis of feedback of the measured voltage, a voltage drop in the second inner heat transfer pattern IHT2 may be reduced or minimized, which may be more advantageous in compensating for a temperature.

However, the embodiment of the present disclosure is not limited thereto. The second inner heat transfer pattern IHT2 may include a metallic material having relatively high resistance. For example, the second inner heat transfer pattern IHT2 may include a metallic material such as platinum (Pt) or nickel (Ni). According to the embodiment, the second inner heat transfer pattern IHT2 may be configured as a single layer or multilayer made of any one of metallic materials such as platinum (Pt) and nickel (Ni) or an alloy thereof. However, this configuration is provided for illustrative purposes only, and the metallic material included in the second inner heat transfer pattern IHT2 is not limited thereto.

As described above, the second inner heat transfer pattern IHT2 includes a metallic material having relatively high resistance, such that the heat generated from the inside of the subpixel SPX may be more effectively dissipated.

In addition, with reference to FIGS. 8, 9A, and 9B, the inner heat transfer patterns may further include the third inner heat transfer pattern IHT3 disposed on the same layer as the intermediate metal layer IM and disposed to be spaced apart from the intermediate metal layer IM.

The third inner heat transfer pattern IHT3 may be in contact with the second inner heat transfer pattern IHT2 through a contact hole (e.g., a third insulation contact hole) at least partially formed through the first interlayer insulation layer 134. Therefore, the third inner heat transfer pattern IHT3 may be electrically connected to the second inner heat transfer pattern IHT2.

The third inner heat transfer pattern IHT3 may include a metallic material. For example, the third inner heat transfer pattern IHT3 may include a metallic material such as molybdenum (Mo) or titanium (Ti). According to the embodiment, the third inner heat transfer pattern IHT3 may be configured as a single layer or multilayer made of any one of metallic materials such as molybdenum (Mo) and titanium (Ti) or an alloy thereof. However, this configuration is provided for illustrative purposes only, and the metallic material included in the third inner heat transfer pattern IHT3 is not limited thereto.

According to the embodiment, the third inner heat transfer pattern IHT3 and the intermediate metal layer IM may include the same material. In this case, the third inner heat transfer pattern IHT3 and the intermediate metal layer IM may be simultaneously formed by the same process. In this case, the third inner heat transfer pattern IHT3 may be formed by means of a design area used for the process of forming the intermediate metal layer IM, which may be more advantageous in terms of spatial efficiency.

In addition, as described above, in case that the third inner heat transfer pattern IHT3 includes a metallic material (e.g., molybdenum (Mo), titanium (Ti), or the like) having low resistance, the display device 100 may be manufactured by increasing a resistance path in the third inner heat transfer pattern IHT3 during the process of manufacturing the display device 100. In this case, in case that a voltage of any one of the plurality of heat transfer patterns (e.g., the inner heat transfer pattern and/or the outer heat transfer pattern) is measured by the voltage sensing circuit (e.g., the voltage sensing circuit included in the first printed circuit board PCB1) and/or in case that the voltage feedback circuit (e.g., the voltage feedback circuit included in the second printed circuit board PCB2) to be described below applies a feedback voltage to another of the plurality of heat transfer patterns (e.g., the inner heat transfer pattern and/or the outer heat transfer pattern) on the basis of feedback of the measured voltage, a voltage drop in the third inner heat transfer pattern IHT3 may be reduced or minimized, which may be more advantageous in compensating for a temperature.

However, the embodiment of the present disclosure is not limited thereto. The third inner heat transfer pattern IHT3 may include a metallic material having relatively high resistance. For example, the third inner heat transfer pattern IHT3 may include a metallic material such as platinum (Pt) or nickel (Ni). According to the embodiment, the third inner heat transfer pattern IHT3 may be configured as a single layer or multilayer made of any one of metallic materials such as platinum (Pt) and nickel (Ni) or an alloy thereof. However, this configuration is provided for illustrative purposes only, and the metallic material included in the third inner heat transfer pattern IHT3 is not limited thereto.

As described above, the third inner heat transfer pattern IHT3 includes a metallic material having relatively high resistance, such that the heat generated from the inside of the subpixel SPX may be more effectively dissipated.

As described above, the display device according to the embodiments of the present disclosure includes the plurality of heat transfer patterns that overlaps the plurality of pixels, respectively, and includes a metallic material, such that the heat generated from the inside of the plurality of pixels may be effectively discharged through the heat transfer patterns. Therefore, it is possible to improve the effect of dissipating heat from the plurality of pixels.

In addition, the display device according to the embodiments of the present disclosure further includes the heat transfer gel disposed between the plurality of heat transfer patterns and the plurality of pixels, and the heat transfer patterns are more effectively and tightly attached to the concave-convex surface by means of the heat transfer gel, such that the heat transfer may be more effectively performed, and the heat dissipation effect may be further improved.

In addition, the display device according to the embodiments of the present disclosure may include the voltage sensing circuit configured to measure the voltage of any one of the plurality of heat transfer patterns, and the voltage feedback circuit configured to provide feedback on the measured voltage and apply feedback voltages to another of the plurality of heat transfer patterns. Therefore, in case that the temperatures in the plurality of pixels are decreased to be lower than the reference value, the temperatures in the plurality of pixels may be increased by the reference value by the feedback voltages applied to the plurality of heat transfer patterns, such that the temperature compensation may be effectively performed on the plurality of pixels.

In addition, the display device according to the embodiments of the present disclosure may include the trench structure, and each of the plurality of pixels may be disposed in the trench structure. Therefore, the level difference related to the plurality of connection lines is reduced, which may improve the reliability of signal transmission through the plurality of connection lines and improve the reliability related to flexibility of the plurality of connection lines.

The exemplary embodiments of the present disclosure can also be described as follows:

A display device according to an embodiment of the present disclosure includes: a flexible substrate configured to be stretchable and divided into a first area, a second area, and a third area; a plurality of pixels disposed in the first area of the flexible substrate; a plurality of heat transfer patterns disposed in the first area of the flexible substrate and configured to overlap the plurality of pixels, respectively; a plurality of connection lines disposed in the second area of the flexible substrate and connected to the plurality of pixels, respectively; and a plurality of heat transfer lines disposed in the second area of the flexible substrate and connected to the plurality of heat transfer patterns, respectively, thereby effectively compensating for a temperature of the display device.

the plurality of heat transfer patterns may comprise inner heat transfer patterns disposed inside each of the plurality of pixels; and outer heat transfer patterns disposed outside each of the plurality of pixels.

The outer heat transfer patterns may comprise a first outer heat transfer pattern disposed in parallel with each of the plurality of pixels and a plurality of second outer heat transfer patterns disposed to be perpendicular to each of the plurality of pixels.

The display device of claim may further comprise a heat transfer gel disposed between the first outer heat transfer pattern and each of the plurality of pixels.

The first outer heat transfer pattern may be in contact with at least one of the plurality of second outer heat transfer patterns.

The outer heat transfer patterns may further comprise a third outer heat transfer pattern disposed in parallel with each of the plurality of pixels and configured to connect the plurality of second outer heat transfer patterns.

The first outer heat transfer pattern may be a plate shape.

The first outer heat transfer pattern may be a matrix shape.

Each of the plurality of pixels may comprise a light-emitting element, a transistor disposed below the light-emitting element and comprising a gate electrode, a source electrode, a drain electrode, and an active layer, the transistor being configured to operate the light-emitting element; and a shield metal layer disposed below the transistor and configured to protect the transistor.

The inner heat transfer patterns may comprise a first inner heat transfer pattern disposed on the same layer as the shield metal layer and disposed to be in contact with the outer heat transfer pattern through a first insulation contact hole.

The inner heat transfer patterns may comprise a second inner heat transfer pattern disposed on the same layer as the gate electrode and disposed to be in contact with the first inner heat transfer pattern through a second insulation contact hole.

The inner heat transfer patterns may further comprise a third inner heat transfer pattern disposed on a layer above the gate electrode and disposed to be in contact with the second inner heat transfer pattern through a third insulation contact hole.

The display device may further comprise a rigid substrate disposed on the flexible substrate, the rigid substrate may comprise at least one trench corresponding to the first area, and each of the plurality of pixels may be disposed in the at least one trench.

The display device may further comprise a heat transfer gel disposed between the plurality of connection lines and the plurality of heat transfer lines.

The display device may further comprise a voltage sensing circuit configured to measure a voltage of any one of the plurality of heat transfer patterns; and a voltage feedback circuit configured to provide feedback on the measured voltage and apply a feedback voltage to another of the plurality of heat transfer patterns.

The display device may further comprise a plurality of power patterns disposed in the third area of the flexible substrate and connected to the plurality of heat transfer patterns, wherein the voltage sensing circuit may be connected to any one of the plurality of power patterns, and wherein the voltage feedback circuit is connected to another of the plurality of power patterns.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a flexible substrate configured to be stretchable, the flexible substrate having a first area, a second area, and a third area;

a plurality of pixels disposed in the first area of the flexible substrate;

a plurality of heat transfer patterns disposed in the first area of the flexible substrate and configured to overlap the plurality of pixels, respectively;

a plurality of connection lines disposed in the second area of the flexible substrate and coupled to the plurality of pixels, respectively; and a plurality of heat transfer lines disposed in the second area of the flexible substrate and coupled to the plurality of heat transfer patterns, respectively.

2. The display device of claim 1, wherein the plurality of heat transfer patterns comprises:

inner heat transfer patterns disposed inside each of the plurality of pixels; and outer heat transfer patterns disposed outside each of the plurality of pixels.

3. The display device of claim 2, wherein the outer heat transfer patterns comprise:

a first outer heat transfer pattern disposed in parallel with each of the plurality of pixels; and a plurality of second outer heat transfer patterns disposed to be perpendicular to each of the plurality of pixels.

4. The display device of claim 3, further comprising:

a heat transfer gel disposed between the first outer heat transfer pattern and each of the plurality of pixels.

5. The display device of claim 3, wherein the first outer heat transfer pattern is in contact with at least one of the plurality of second outer heat transfer patterns.

6. The display device of claim 3, wherein the outer heat transfer patterns further comprise a third outer heat transfer pattern disposed in parallel with each of the plurality of pixels and configured to couple the plurality of second outer heat transfer patterns.

7. The display device of claim 3, wherein the first outer heat transfer pattern is a plate shape.

8. The display device of claim 3, wherein the first outer heat transfer pattern is a matrix shape.

9. The display device of claim 2, wherein each of the plurality of pixels comprises:

a light-emitting element;

a transistor disposed below the light-emitting element and comprising a gate electrode, a source electrode, a drain electrode, and an active layer, the transistor being configured to operate the light-emitting element; and a shield metal layer disposed below the transistor and configured to protect the transistor.

10. The display device of claim 9, wherein the inner heat transfer patterns comprise a first inner heat transfer pattern disposed on the same layer as the shield metal layer and disposed to be in contact with the outer heat transfer pattern through a first insulation contact hole.

11. The display device of claim 10, wherein the inner heat transfer patterns comprise a second inner heat transfer pattern disposed on the same layer as the gate electrode and disposed to be in contact with the first inner heat transfer pattern through a second insulation contact hole.

12. The display device of claim 11, wherein the inner heat transfer patterns further comprise a third inner heat transfer pattern disposed on a layer above the gate electrode and disposed to be in contact with the second inner heat transfer pattern through a third insulation contact hole.

13. The display device of claim 1, further comprising:

a rigid substrate disposed on the flexible substrate, wherein the rigid substrate comprises at least one trench corresponding to the first area, and wherein each of the plurality of pixels is disposed in the at least one trench.

14. The display device of claim 1, further comprising:

a heat transfer gel disposed between the plurality of connection lines and the plurality of heat transfer lines.

15. The display device of claim 1, further comprising:

a voltage sensing circuit configured to measure a voltage of any one of the plurality of heat transfer patterns; and a voltage feedback circuit configured to provide feedback on the measured voltage and apply a feedback voltage to another of the plurality of heat transfer patterns.

16. The display device of claim 15, further comprising:

a plurality of power patterns disposed in the third area of the flexible substrate and connected to the plurality of heat transfer patterns, wherein the voltage sensing circuit is coupled to any one of the plurality of power patterns, and wherein the voltage feedback circuit is coupled to another of the plurality of power patterns.

17. A display device comprising:

a flexible substrate configured to be stretchable;

a plurality of pixels on the flexible substrate;

a plurality of heat transfer patterns on the flexible substrate and configured to overlap the plurality of pixels, respectively;

a plurality of connection lines on the flexible substrate and coupled to the plurality of pixels, respectively; and a plurality of heat transfer lines on the flexible substrate and coupled to the plurality of heat transfer patterns, respectively.

18. The display device of claim 17, wherein the plurality of heat transfer patterns comprises:

inner heat transfer patterns disposed inside each of the plurality of pixels; and outer heat transfer patterns disposed outside each of the plurality of pixels.

19. The display device of claim 18, wherein the outer heat transfer patterns comprise:

a first outer heat transfer pattern on the flexible substrate; and a plurality of second outer heat transfer patterns protruding towards the flexible substrate.

* * * * *